US007250113B2

(12) United States Patent
Komuro et al.

(10) Patent No.: US 7,250,113 B2
(45) Date of Patent: Jul. 31, 2007

(54) METHOD FOR MANUFACTURING LIQUID EJECTION HEAD

(75) Inventors: Hirokazu Komuro, Kanagawa (JP); Fumio Murooka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 368 days.

(21) Appl. No.: 10/868,854

(22) Filed: Jun. 17, 2004

(65) Prior Publication Data

US 2004/0259372 A1 Dec. 23, 2004

(30) Foreign Application Priority Data

Jun. 23, 2003 (JP) ............................ 2003-178549
Jun. 1, 2004 (JP) ............................ 2004-163739

(51) Int. Cl.
*B41J 2/04* (2006.01)
*H01L 21/00* (2006.01)

(52) U.S. Cl. ............................ 216/27; 216/2; 216/41; 438/21; 438/745; 29/890.1

(58) Field of Classification Search .................... 216/2, 216/27, 41; 438/21, 745; 29/890.1
See application file for complete search history.

(56) References Cited

U.S. PATENT DOCUMENTS 4,263,601 A 4/1981 Nishimura et al.
5,804,083 A 9/1998 Ishii et al.
5,877,791 A 3/1999 Lee et al.
6,143,190 A 11/2000 Yagi et al.
6,305,080 B1 10/2001 Komuro et al.
6,450,621 B1 9/2002 Hayakawa
6,663,229 B2 12/2003 Komuro et al.
2002/0075359 A1 6/2002 Wuu et al.
2003/0081068 A1 5/2003 Hayakawa et al.
2006/0071976 A1* 4/2006 Baek et al. .................. 347/54

FOREIGN PATENT DOCUMENTS

| | | |
|---|---|---|
| EP | 0 841 167 | 5/1998 |
| JP | 54-51835 | 4/1979 |
| JP | 10-13849 | 1/1998 |
| JP | 10-181032 | 7/1998 |
| WO | WO 01/03934 | 1/2001 |
| WO | WO 01/36203 | 5/2001 |

* cited by examiner

*Primary Examiner*—Shamim Ahmed
(74) *Attorney, Agent, or Firm*—Fitzpatrick, Cella, Harper & Scinto

(57) ABSTRACT

A method for manufacturing a liquid ejection head having a substrate including an electro-thermal transducer for ejecting a liquid from an ejection opening, an electrode wiring section electrically connecting the electro-thermal transducer and driver element thereof, and a liquid supply port therethrough includes the steps of forming a sacrificial layer by using the same material as the electrode wiring section at a position at which the liquid supply port is to be formed during forming the electrode wiring section, forming an anti-etching layer covering the sacrificial layer, removing the sacrificial layer by etching the substrate from a surface thereof opposite to the surface on which the electro-thermal transducer is formed to expose the anti-etching layer of a portion to be the liquid supply port, and removing the exposed anti-etching layer to form the liquid supply port in the substrate.

9 Claims, 34 Drawing Sheets

METHOD FOR MANUFACTURING LIQUID EJECTION HEAD

This application claims priority from Japanese Patent Application Nos. 2003-178549 filed Jun. 23, 2003 and 2004-163739 filed Jun. 1, 2004, which are incorporated hereinto by reference.

BACKGROUND OF THE INVENTION

1. Field of the Invention

The present invention relates to a method for manufacturing a liquid ejection head capable of simplifying the manufacturing process and excellent in reliability.

In this Specification, a word “print” refers to not only forming a significant information, such as characters and figures, but also forming images, designs or patterns on a printing medium and processing such as etching and so forth in the printing medium, whether the information is significant or insignificant or whether it is visible so as to be perceived by humans. The term “printing medium” includes not only paper used in common printing apparatus, but also sheet materials such as cloths, plastic films, metal sheets, glass plates, ceramic sheets, wood panels and leathers or three-dimensional materials such as spheres, round pipes and so forth which can receive the ink. The word “ink” should be interpreted in its wide sense as with the word “print”, refers to liquid that is applied to the printing medium for forming images, designs or patterns, processing such as etching in the printing medium or processing such as coagulating or insolubilizing a colorant in the ink and includes any liquids used for printing.

2. Description of the Related Art

As a conventional art, an ink-jet printing method disclosed in Japanese Patent Application Laid-open No. 54-51835(1979) is characterized in that a driving force for ejecting a liquid droplet is obtained by applying a thermal energy to the liquid, which is different from other ink-jet printing methods. That is, according to this ink-jet printing method, the liquid subjected to the operation of the thermal energy is vaporized to generate air bubbles. The expansion force accompanied with the growth of the bubbles makes liquid droplets to be ejected from an orifice of a printing head to a printing medium so that a predetermined image information such as characters or images is printed on the printing medium. The printing head used for this ink-jet printing method generally includes an nozzle orifice for ejecting the liquid, a liquid chamber communicating with the nozzle orifice, for storing the liquid to be ejected, an ejection energy generator disposed in the liquid chamber, for generating the thermal energy for ejecting the liquid droplet from the nozzle orifice, a protecting layer for protecting the ejection energy generator from the liquid, and a heat storage layer for storing the thermal energy generated from the ejection energy generator.

Also, in Japanese Patent Application Laid-open No. 10-13849(1998), a method is disclosed, for forming, by an anisotropic etching, a liquid supply port communicating with the above-mentioned liquid chamber to supply the liquid to this liquid chamber. In Japanese Patent Application Laid-open No. 10-181032(1998), a method is disclosed, for forming the liquid supplying port more precisely by further using a sacrificial layer. In this Japanese Patent Application Laid-open No. 10-181032(1998), a concrete process performed by the sacrificial layer during the high-precision etching is described in the explanation of a first embodiment with reference to FIGS. 1 to 3.

One example of a process for manufacturing the liquid supply port in the conventional printing head described above will be described with reference to FIGS. 27 to 34 based on the technique disclosed in Japanese Patent Application Laid-open No. 10-181032(1998) as follows. A $SiO_2$ layer 2 is formed by oxidizing the surface of a silicon substrate 1 and deposits a $Si_3N_4$ layer 3 thereon by a reduced pressure CVD method (see FIG. 27). Then, a patterning is carried out to leave the $Si_3N_4$ layer 3 solely in the vicinity of a region in which a sacrificial layer 4 described later is formed. At this time, all of the $Si_3N_4$ layer 3 deposited on the rear surface of the silicon substrate is removed by the etching during the patterning (see FIG. 28). Next, the silicon substrate 1 is further heat-oxidized to grow the $SiO_2$ layer 2. At this time, a portion disposed directly beneath the patterned $Si_3N_4$ layer 3 is not oxidized but solely the $SiO_2$ layer 2 disposed on the opposite sides thereof is selectively oxidized, whereby a thickness of the $SiO_2$ layer 2 not covered with the $Si_3N_4$ layer 3 increases. Thereafter, the $Si_3N_4$ layer 3 is removed by the etching (see FIG. 29). Then, to form a sacrificial layer 4 of polysilicon, a portion of the $SiO_2$ layer 2 having a thin film thickness because this portion has been covered with the $Si_3N_4$ layer 3 is removed by the etching, and instead, the sacrificial layer 4 of polysilicon is formed in this portion (see FIG. 30). Next, an etching-stop layer 5 encircling this sacrificial layer 4 is formed of $Si_3N_4$ which stress is adjusted by the reduced pressure CVD method, and a whole surface thereof is covered with a phospho-silicate glass (PSG) layer 6 (see FIG. 31). Further, a second $SiO_2$ layer 7 is formed on the PSG layer 6 by a plasma CVD method (see FIG. 32), and the $SiO_2$ layer 7 and the PSG layer 6 are patterned, after which a second $Si_3N_4$ layer 8 reaching the etching-stop layer 5 is formed all over a surface thereof by the plasma CVD method (see FIG. 33). Thereafter, a liquid supply port 9 extending from the rear surface side of the silicon substrate 1 to the sacrificial layer 4 is formed by the anisotropic etching (see FIG. 34).

Japanese Patent Application Laid-open No. 2003-136492 discloses that if the sacrificial layer is formed of polysilicon by the same process as a film-forming process or an etching process for a gate electrode of a MOS transistor in a drive circuit or others, an exclusive mask for the sacrificial layer becomes unnecessary.

However, since a resistivity of polysilicon is generally high, it is necessary to lower the resistivity when used as the gate electrode of the transistor, for example, by doping impurity. On the other hand, since an etching speed of polysilicon doped with impurity is liable to lower, it is unsuitable for using polysilicon as a material for the sacrificial layer which needs the etching speed higher than that of a material to be etched. Accordingly, when the electrode and the sacrificial layer are formed of the same material; polysilicon; for the purpose of saving the manufacturing process, one or both of the electrode and the sacrificial layer may be lower in performance, whereby it is impossible to merely use the polysilicon as it is.

Further, since the PSG layer may be dissolved by an etching liquid when the PSG layer is provided on a wiring layer such as a gate electrode, there is a case that it is unsuitable as an anti-etching layer. For example, when a predetermined portion of the PSG layer 6 is etched as one of processes shown in FIGS. 32 to 33 for supplying the liquid fed from a lower part of the substrate via the liquid supply port 9 to an upper part of the substrate, the sacrificial layer 4 is directly exposed to the etching liquid unless the etching-stop layer 5 covering the sacrificial layer 4 is separately provided.

In the prior art, to avoid such a problem, the etching-stop layer 5 formed of $Si_3N_4$ is provided between the sacrificial layer 4 and the PSG layer 6. Accordingly, in a case wherein the PSG layer is provided on the wiring electrode, an anti-etching layer of silicon nitride used as the etching-stop layer is formed in a structure around the liquid supply port before the PSG layer is provided, so that the etching of the PSG layer is possible without affecting the sacrificial layer of polysilicon.

Also, since the anti-etching layer of silicon nitride must be heated at a predetermined temperature when formed by the reduced pressure CVD method, polysilicon is used for the sacrificial layer formed together with the wiring layer in the same process.

Accordingly, in the conventional structure, there has been no method for manufacturing a liquid ejection head capable of reducing the manufacturing processes while maintaining the uniformity of sacrificial layers in the respective substrates taken from the same wafer.

SUMMARY OF THE INVENTION

An object of the present invention is to provide a method for manufacturing a liquid-ejection head high in accuracy and in reliability while simplifying the manufacturing process thereof, wherein, prior to forming a liquid supply port passing through an insulating layer by the etching starting from a rear surface side of a substrate, a sacrificial layer in which the etching proceeds faster than in the substrate is formed on a surface of the substrate at a position corresponding to the liquid supply port and an etching-stop layer for interrupting the progress of the etching is formed in contact at least with the upper surface of the sacrificial layer.

To achieve the above-mentioned object, a method for manufacturing a liquid ejection head according to the present invention having a substrate including an ejection energy generating section for ejecting a liquid from an ejection opening, a driver element provided as a lower layer of the ejection energy generating section via an insulating layer for driving the ejection energy generating section, an electrode wiring section electrically connecting the driver element to the ejection energy generating section, formed of a material mainly composed of aluminum, a protective layer formed on the insulating layer to cover the ejection energy generating section, and a liquid supply port therethrough, comprises the steps of forming a sacrificial layer at a position at which the liquid supply port is to be formed, by using the same material as that of the electrode wiring section, when the electrode wiring section is formed, forming an anti-etching layer for covering the sacrificial layer, having the durability against an etching liquid, etching the substrate with the etching liquid from a surface of the substrate on which the ejection energy generating section is formed until the sacrificial layer is exposed, further proceeding the etching to remove the sacrificial layer and expose a portion of the anti-etching layer to be the liquid supply port, and forming the liquid supply port in the substrate by removing the exposed anti-etching layer.

According to the present invention, a separate process for forming the sacrificial layer is eliminated but such a process for manufacturing the sacrificial layer is carried out simultaneously with a process for forming an electrode wiring section, and the liquid supply head high in accuracy and in reliability is obtainable.

In the method for manufacturing the liquid ejection head according to the present invention, the sacrificial layer may be formed of by using the same material, as that of the electrode wiring section, for example a material mainly composed of aluminum. In this case, the manufacturing processes may be reduced while the uniformity of sacrificial layers may be maintained in the respective substrates.

The material forming the insulating layer may be silicon oxide and that forming the protective layer may be silicon nitride. In this case, even if the anti-etching layer is formed in a film state, the reliability thereof is still high to further enhance the yield during the anisotropic etching.

The driver element may be a transistor, and the electrode wiring section may include a source and a drain of the transistor.

The anti-etching layer may be formed to encircle the upper surface and the side surface of the sacrificial layer, further may be formed by using the same material as that of the insulating layer or the protective layer and at the same step as that for forming the insulating layer or the protective layer. In this case, the anti-etching layer may be formed by the plasma CVD method so as to have a residual stress of $3\times10^8$ dyn/cm$^2$ or less. Alternatively, the anti-etching layer may be formed by the plasma CVD method so that a tensile stress and a compressive stress are residual in a double-layered structure.

The ejection energy generating section may have an electro-thermal transducer for generating thermal energy for ejecting liquid from the ejection opening by generating the film boiling in the liquid.

The liquid ejection head further has an upper plate member formed above the insulating layer of the substrate to define a liquid chamber between the upper plate member and the insulating layer and having the ejection opening communicated with the liquid chamber, the method according to the present invention may further comprise the steps of forming a first resinous layer having a shape corresponding to the liquid chamber on the protective layer, forming a second resinous layer having a shape corresponding to the upper plate member on the first resinous layer, removing a portion of the second resinous layer corresponding to the ejection opening from the second resinous layer, and removing the first resinous layer after the upper plate member has been formed.

One feature of the present invention is to use a material mainly composed of aluminum for the wiring provided in a layer disposed above the sacrificial layer and the PSG layer and that disposed beneath the heat-generation resistive layer.

In the present invention, it is possible to use aluminum as a material for forming the sacrificial layer and the wiring layer, but impossible to use polysilicon as a material for forming the sacrificial layer and the wiring layer. Reasons therefore are the following four points:

1. Since polysilicon is generally high in resistivity, it is necessary to lower the resistivity, for example, by doping impurity therein if the polysilicon is used as a wiring resistive layer for a gate electrode in a transistor.
2. Regarding the sacrificial layer, when tetramethylammonium hydroxide (TMAH) is used as an anisotropic etching liquid, an isotropic etching speed of a material to be mainly etched by TMAH must be higher than the anisotropic etching speed thereof. However, when the impurity is doped, the former etching speed is liable to lower.
3. Due to the above-mentioned reasons 1 and 2, it is impossible in a case of polysilicon to form the wiring layer and the sacrificial layer in the same process in view of the difference between the etching speeds required for the wiring layer and the sacrificial layer, respectively.
4. Since the aluminum is low in resistivity and high in etching speed by the anisotropic etching liquid TMAH, even if both of the wiring layer and the sacrificial layer are formed of aluminum, the performance thereof is not lowered.

According to the present invention, the sacrificial layer is formed of the same material as the wiring material provided above the PSG layer and beneath the heat-generation resistive layer. Reasons therefore are the following two points;

1. The control of the operation under the severe condition is necessary for etching the PSG layer without etching the polysilicon sacrificial layer since there is the PSG layer unsuitable for the anti-etching mask above the wiring layer which becomes the gate electrode. Especially, when the operation is carried out for cutting a number of substrates out from a single wafer, it is very difficult to leave the sacrificial layers in the respective substrates while maintaining the uniform shape.
2. Since the material for the heat-generation resistive layer functions as an anti-etching layer, a novel patterning process is necessary wherein the material is not left beneath the sacrificial layer.

In this regard, according to the present invention, the wiring material mainly composed of aluminum includes aluminum of 100% fineness, a so-called Al—Si alloy containing silicon in a range from 1 to 5% in aluminum or Al—Cu alloy containing copper in aluminum.

The above and other objects, effects, features and advantages of the present invention will become more apparent from the following description of embodiments thereof taken in conjunction with the accompanying drawings.

DETAILED DESCRIPTION OF PREFERRED EMBODIMENTS

While embodiments of the inventive method for manufacturing a liquid ejection head will be described below in detail with reference to FIGS. 1 to 26, the present invention should not be limited to such embodiments but may be applicable to other techniques to be includes in a concept of the present invention defined by a scope of claim for patent.

Figure 1:
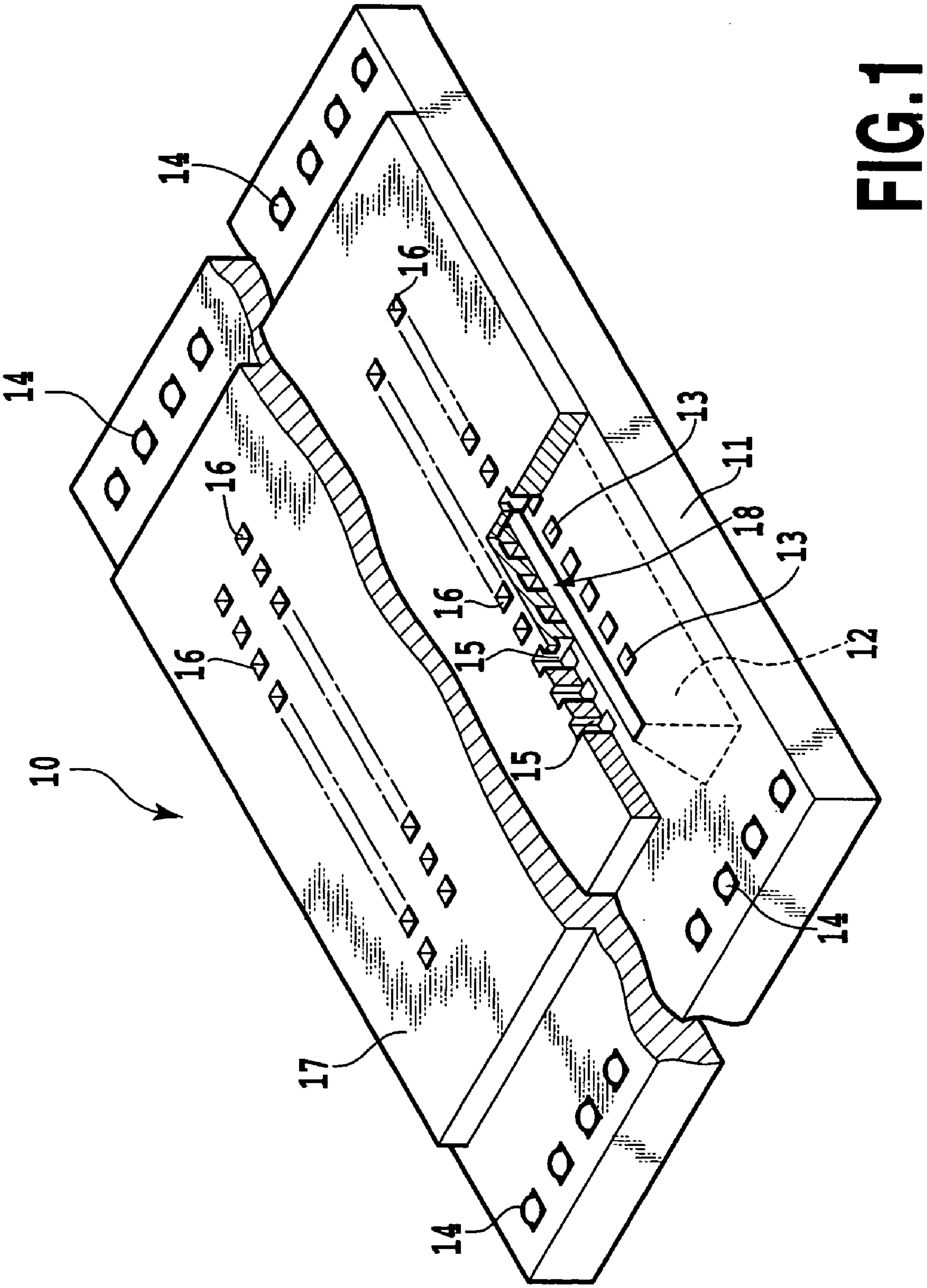
FIG. 1 is a perspective view of an appearance of a printing element substrate constituting a main part of a printing head according to a first embodiment of the present invention.
Figure 2:
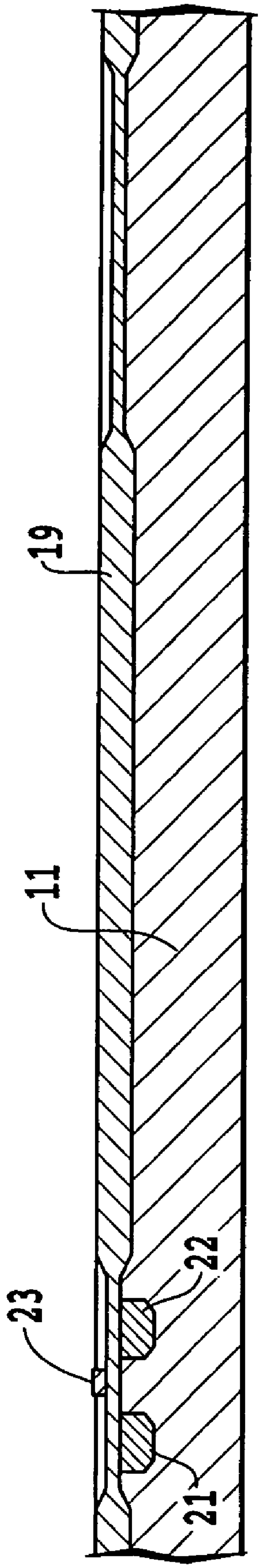
FIG. 2 is a sectional view of the printing element substrate representing a process for manufacturing the printing head according to the first embodiment of the present invention.
Figure 3:
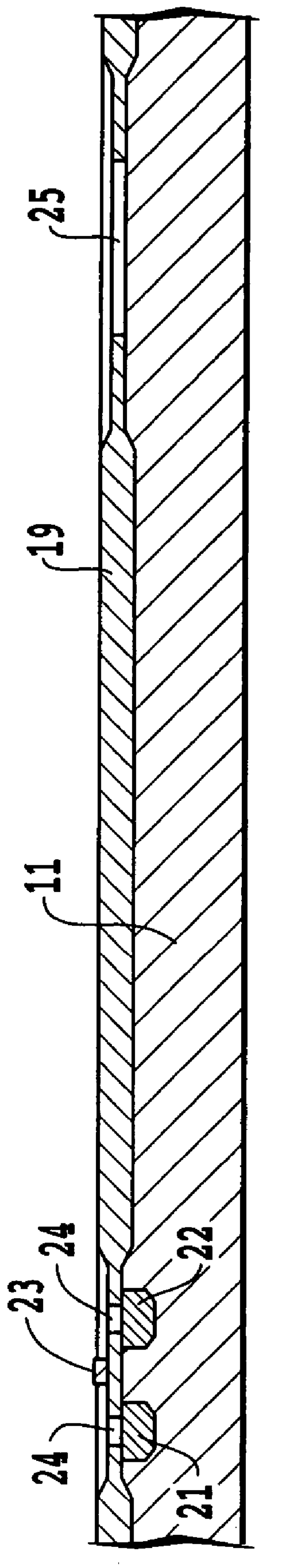
FIG. 3 is a sectional view of the printing element substrate representing a process for manufacturing the printing head according to the first embodiment of the present invention.
Figure 4:
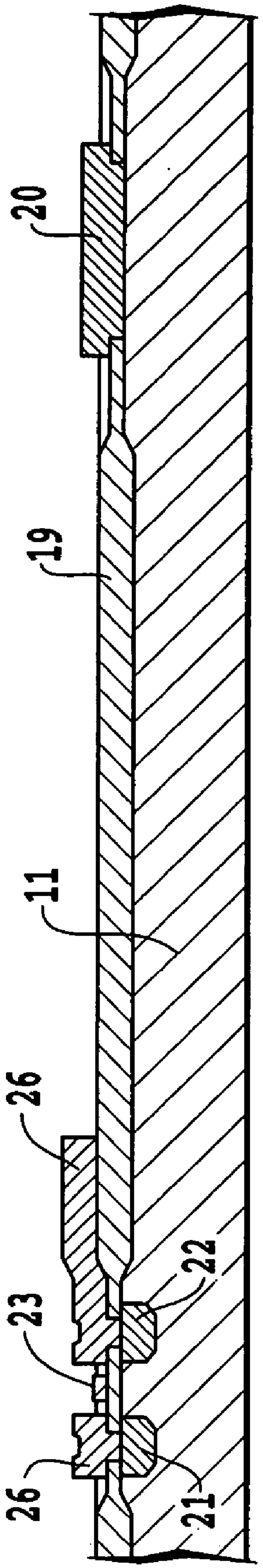
FIG. 4 is a sectional view of the printing element substrate representing a process for manufacturing the printing head according to the first embodiment of the present invention.

A structure of a printing element substrate 10 in a printing head according to a first embodiment is shown in FIG. 1. In the printing element substrate 10, ejection energy generators, liquid chambers, ejection openings or others are formed on a silicon substrate 11 of 0.5 to 1 mm thick.

In the silicon substrate 11, a liquid supply port 12 of an elongate hole shape is formed to pass through the same. On opposite sides of the liquid supply port 12, a plurality of electro-thermal transducers 13 are arranged at a predetermined gap in a lengthwise direction of the liquid supply port 12 while shifting half a pitch from one on the opposite side, whereby the ejection energy generator is constituted. In the silicon substrate 11, other than the electro-thermal transducers 13, there are electrode terminals 14 for electrically connecting the electro-thermal transducers 13 to a printer body and electric wiring not shown made, for example, of aluminum, both of which are formed by the deposition technique. A drive signal is input from a driving IC not shown to the electro-thermal transducer 13 via these electrode terminals 14, and simultaneously therewith, a driving power is supplied to the electro-thermal transducers 13.

On the silicon substrate 11, there is an upper plate member 17 having a plurality of ejection openings 16 confronting the electro-thermal transducers 13, respectively, via the liquid chambers 15. That is, a liquid path 18 for communicating the liquid supply port 12 with the individual liquid chambers 15 is formed between the upper plate member 17 and the silicon substrate 11, all of which are formed together with the upper plate member 17 by a lithographic technique in the same manner as the ejection openings 16.

Liquid supplied from the liquid supply port 12 to the respective liquid chamber 15 boils by the heat generation of the electro-thermal transducer 13 when a drive signal is input to the electro-thermal transducer 13 in the corresponding liquid chamber 15, and is ejected from the ejection opening 16 by the pressure of bubbles generated thereby.

Figure 27:
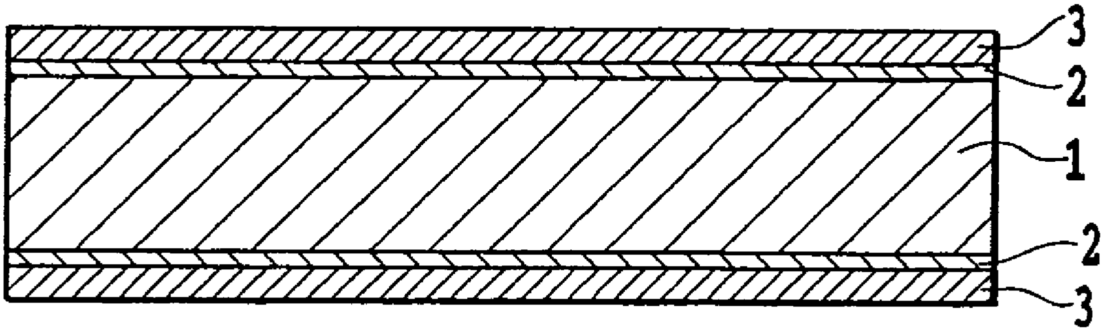
FIG.27 PRIOR ART
FIG. 27 is a sectional view representing a process for manufacturing the printing element substrate of a prior art printing head.
Figure 28:
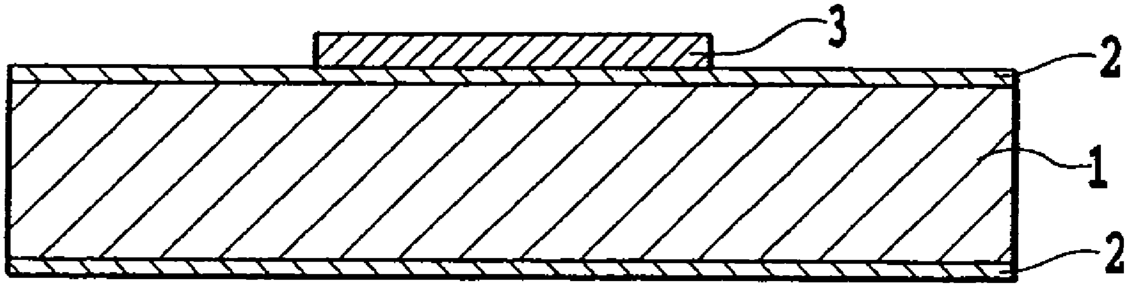
FIG.28 PRIOR ART
FIG. 28 is a sectional view representing a process for manufacturing the printing element substrate of the prior art printing head.
Figure 29:
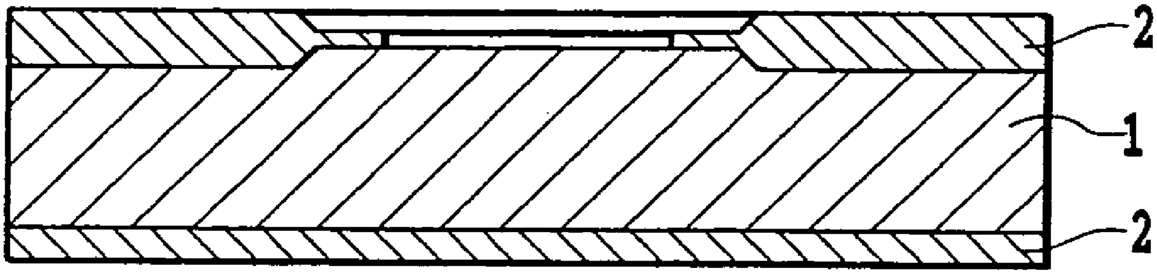
FIG.29 PRIOR ART
FIG. 29 is a sectional view representing a process for manufacturing the printing element substrate of the prior art printing head.
Figure 30:
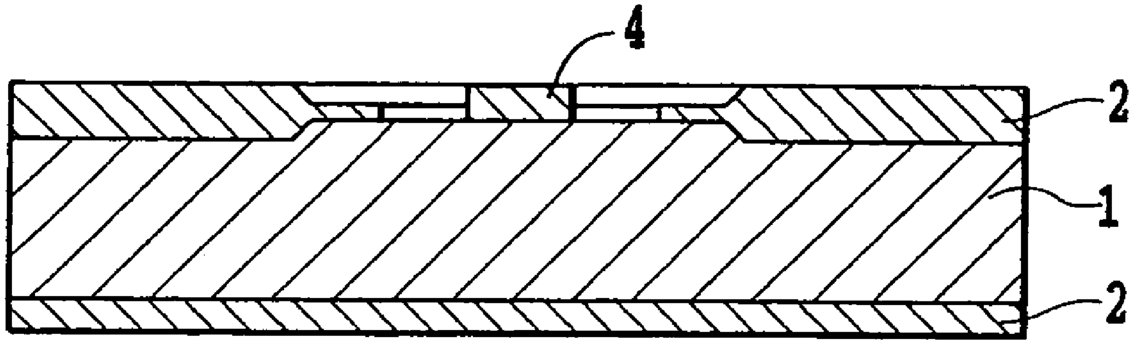
FIG.30 PRIOR ART
FIG. 30 is a sectional view representing a process for manufacturing the printing element substrate of the prior art printing head.
Figure 31:
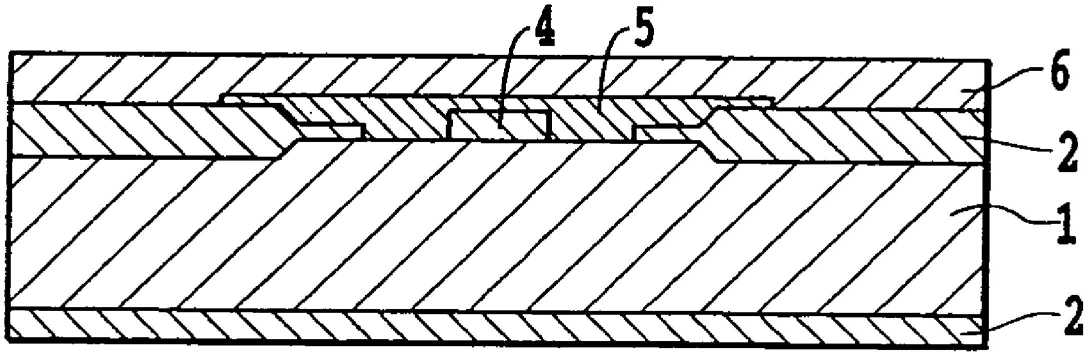
FIG.31 PRIOR ART
FIG. 31 is a sectional view representing a process for manufacturing the printing element substrate of the prior art printing head.
Figure 32:
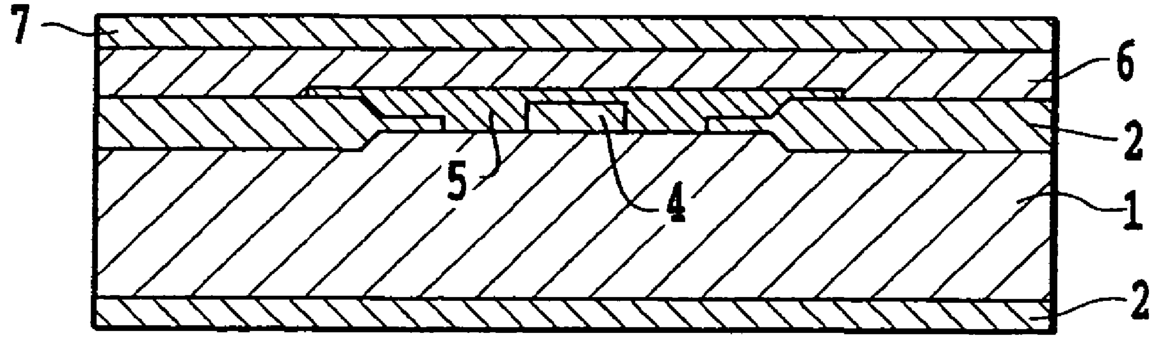
FIG.32 PRIOR ART
FIG. 32 is a sectional view representing a process for manufacturing the printing element substrate of the prior art printing head.
Figure 33:
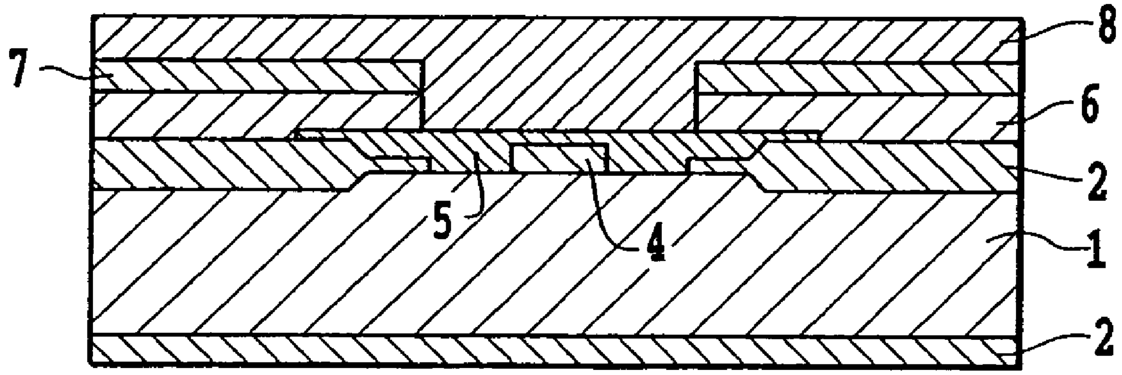
FIG.33 PRIOR ART
FIG. 33 is a sectional view representing a process for manufacturing the printing element substrate of the prior art printing head.
Figure 34:
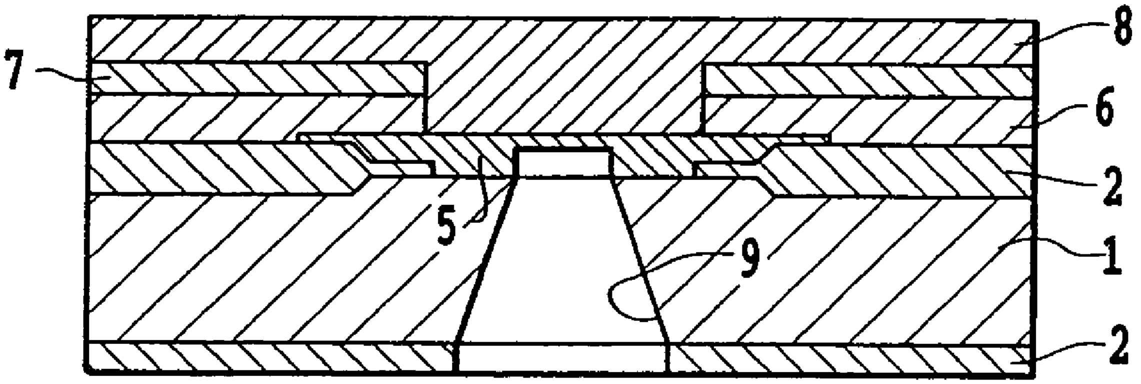
FIG.34 PRIOR ART
FIG. 34 is a sectional view representing a process for manufacturing the printing element substrate of the prior art printing head.

A process for manufacturing such a printing element substrate 10 will be described with reference to FIGS. 2 to 9. First, a P-type silicon substrate 11 of 625 μm thick having the crystalline face orientation of <100> is prepared, which surface is then heat-oxidized to form a $SiO_2$ layer 19 of 0.01 to 0.05 μm thick (corresponding to reference numeral 2 in FIG. 27). Further, a $Si_3N_4$ layer of 0.1 to 0.3 μm (corresponding to reference numeral 3 in FIG. 27) is deposited thereon by the reduced CVD method, and patterned so that this $Si_3N_4$ layer 3 is left solely in a region in which a sacrificial layer 20 described later is formed (see FIG. 28). By the etching during this patterning, all of the $Si_3N_4$ layer 3 formed on the rear surface of the silicon substrate 11 is removed. The silicon substrate 11 is again heat-oxidized in this state to grow the $SiO_2$ layer 19 again so that the thickness thereof becomes 0.6 to 1.1 μm. At this time, since a portion of the silicon substrate 11 directly beneath the $SiO_2$ layer 19 covered with the patterned $Si_3N_4$ layer 3 is not so heat-oxidized, a region of the silicon substrate 11 not interposed with the $Si_3N_4$ layer 3 is selectively oxidized to increase the film thickness more than that covered with the $Si_3N_4$ layer 3. Thereafter, the patterned $Si_3N_4$ layer 3 is removed by the etching (see FIG. 2).

Next, a source 21, a drain 22 and a gate electrode 23 are formed of polysilicon. In this case, the source 21 and the drain 22 are formed on the underside of the $SiO_2$ layer 19 by accelerating arsenic ions to pass through the $SiO_2$ layer 19 and be implanted at a predetermined position in the silicon substrate 11 by the ion implantation method, after which the silicon substrate 11 is heat-treated to diffuse arsenic ions in the silicon substrate 11, and the gate electrode 23 is formed on the $SiO_2$ layer 19 by the patterning (see FIG. 2).

Then, contact openings 24 for the source electrode 21 and the drain electrode 22 of the drive transistor are formed by the patterning and etching of the $SiO_2$ layer 19. Simultaneously, an opening 25 is formed in a portion of the $SiO_2$ layer 19 in which the sacrificial layer 20 is to be formed in the same manner as above (see FIG. 3). A surface of the silicon substrate 11 is exposed to the opening 25.

Next, an electrode wiring layer 26 is formed of an electro-conductive material mainly composed of aluminum, such as Al—Si, for electrically connecting the electrode wiring layer 26 to the contact openings 24 by the patterning, whereby the drive transistor for driving the electro-thermal transducer 13 is completed. Simultaneously therewith, the sacrificial layer 20 using the same material as the electrode wiring layer 26 is formed in the opening 25. Since the same material as the electrode wiring layer 26 is used for forming the sacrificial layer 20, the latter is formed simultaneously with the former in the same process as forming the electrode wiring layer 26, whereby it is possible to eliminate an independent process for forming the sacrificial layer 20.

Then, an insulating layer 27 of $SiO_2$ of 1.0 to 1.8 μm thick is deposited on them by the plasma CVD method. This insulating layer 27 is an inter-layer film for the electrode wiring layer 26.

Next, the patterning and etching of first through-holes 28 are carried out from a surface of the insulating layer 27. A depth of the through-hole 28 is selected not to reach the electrode wiring layer 26 and the sacrificial layer 20. Of these first through-holes 28, those formed opposite to the electrode wiring layer 26 electrically connected with the drain electrode 22 of the drive transistor and opposite to the sacrificial layer 20 are subjected to the patterning and the etching of second through-holes 29 to expose the electrode wiring layer 26 electrically connected to the drain electrode 22 and the sacrificial layer 20.

Then, a surface treatment layer 31 for an embedded wiring layer 30 and an etching-stop layer 32 are formed of the same material as the electro-thermal transducer 13, such as TaN or $TaSi_3N_4$ on the inner wall of the first through-hole 29 and the second through-hole 28 and on the surface of the electrode wiring layer 26 and the sacrificial layer. 20 exposed to the through-hole 29 by the sputtering. While the surface treatment layer 31 and the etching-stop layer 32 are provided for facilitating the adhesive property to the insulating layer 27, they are operable, when the embedded wiring layer 30 and an embedded layer 33 are formed, for example, of copper by the electrolytic plating, also as an electrode therefore. Alternatively, the embedded wiring layer 30 and the embedded layer 33 may be formed of aluminum or the like by the sputtering.

Since the etching-stop layer 32 can be formed of the same material as the surface treatment layer 31 as described above, the etching-stop layer 32 and the surface treatment layer 31 are simultaneously formed by the same process to eliminate an independent process for forming the etching-stop layer 32.

Figure 5:
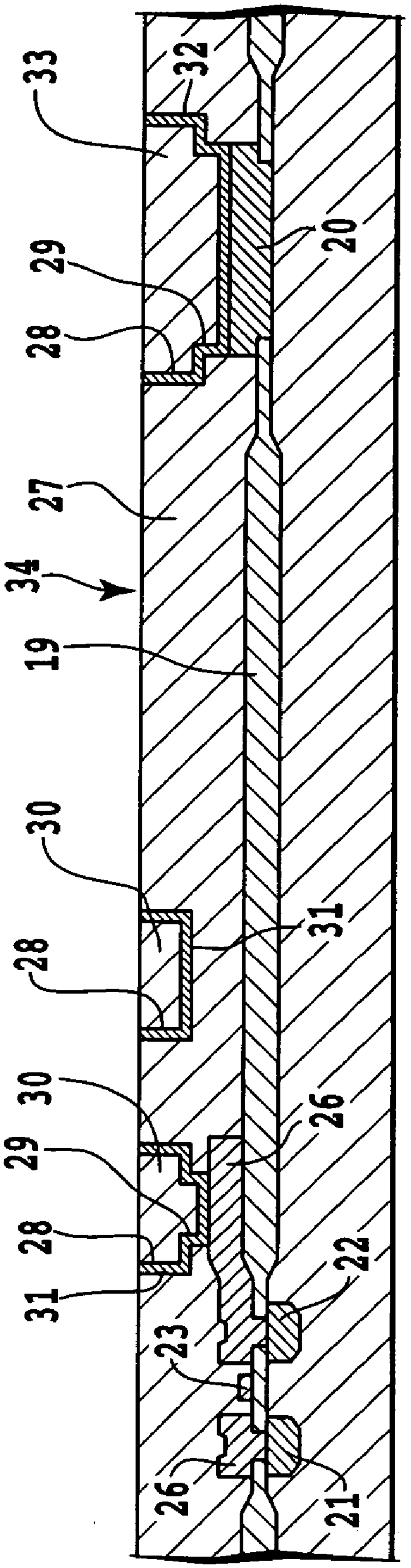
FIG. 5 is a sectional view of the printing element substrate representing a process for manufacturing the printing head according to the first embodiment of the present invention.
Figure 6:
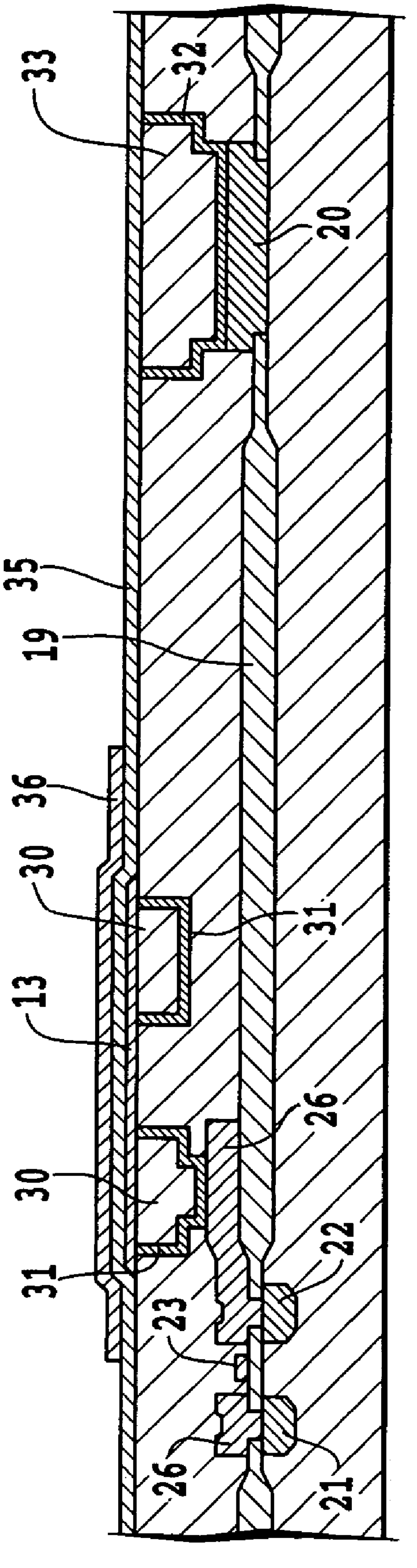
FIG. 6 is a sectional view of the printing element substrate representing a process for manufacturing the printing head according to the first embodiment of the present invention.

After the embedded wiring layer 30 and the embedded layer 33 have been simultaneously formed in the first through-hole 28 and the second through-hole 29 in which the surface treatment layer 31 and the etching-stop layer 32 are formed, a whole surface is polished by a CMP method to form a flat surface 34 (see FIG. 5).

Next, a film of TaN or $TaSi_3N_4$ having a thickness of 0.02 to 0.2 μm which is to be the electro-thermal transducer 13 is formed while striding over the embedded layer 33 by the patterning. Further, a first protective layer 35 is formed of $Si_3N_4$ by the plasma CVD method, and a second protective layer 36 is formed by the patterning while covering the electro-thermal transducer 13 via the first protective layer 35 (see FIG. 6).

Thereafter, to form the liquid supply port 12 in the silicon substrate 11, a resin (not shown) to be an anisotropic etching mask is coated on the rear surface of the silicon substrate 11 and processed to have a desired pattern by the lithography.

Sequentially, the process proceeds to the formation of the upper plate 17, wherein a resist to be a core 37 for forming the liquid path 18 and the liquid chambers 15 is coated on the surface and patterned to have a predetermined shape.

Then, photosensitive epoxy resin to be the upper plate member 17 is coated on the core 37 and patterned to form the ejection openings 16 by the photolithography.

Next, the liquid supply port 12 reaching the sacrificial layer 20 is formed by the etching carried out on the rear surface of the silicon substrate 11, while using TMAH as the anisotropic etching liquid. This etching proceeds from the rear surface of the silicon substrate 11 at an angle of 55 degrees and reaches the sacrificial layer 20 encircled by the $SiO_2$ layer 19 and the etching-stop layer 32. Since the sacrificial layer 20 is isotropically etched by this etching liquid, the liquid supply port 12 has an upper end shaped in correspondence to the sacrificial layer 20 and widening toward the rear surface of the silicon substrate 11 in a tapered manner.

Then, after the etching-stop layer 32 and the embedded layer 33 have been removed by the etching, a portion of the first protective layer 35 exposed to the liquid supply port 12 is removed by the dry etching (see FIG. 8), and the core 37 is removed by the etching. Thus, the printing element substrate 10 is manufactured (see FIG. 9).

As described above, when the printing element substrate 10 is manufactured, it is unnecessary to add a new process for forming the sacrificial layer 20 and the etching-stop layer 32, whereby the manufacturing process is simplified to suppress the increase in production cost and reduce a cycle time as well as the liquid supply port 12 is precisely formed.

In the above-mentioned embodiment, when the sacrificial layer 20 is etched to form the liquid supply port 12, there is a possibility in that a portion of the insulating layer 27 adjacent to the sacrificial layer 20 is etched by the etching liquid and it is difficult to maintain the liquid supply port 12 at a desired dimension. Accordingly, to avoid such an inconvenience, the sacrificial layer 20 may be covered with the etching-stop layer 32.

Such a second embodiment of the present invention will be described with reference to FIGS. 10 to 13, wherein parts having the same functions as in the preceding embodiment are indicated by the same reference numerals and the redundant explanation thereof are eliminated. That is, while the etching-stop layer 32 is solely brought into contact with the upper end surface of the sacrificial layer 20 in the preceding embodiment, the etching-stop layer 32 extends to the $SiO_2$ layer 19 to cover the sacrificial layer 20 according to this embodiment (see FIG. 10). Thereby, it is possible to completely shut the insulating layer 27 from the sacrificial layer 20.

Figure 10:
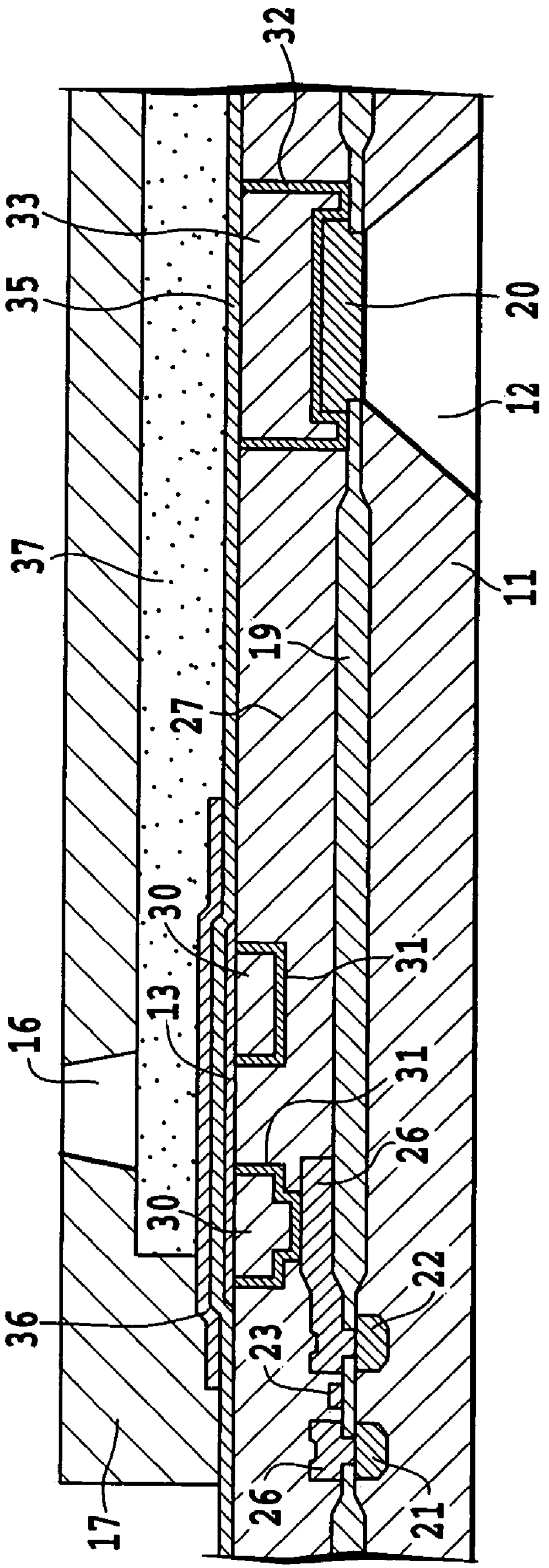
FIG. 10 is a sectional view of a printing element substrate representing a process for manufacturing a printing head according to a second embodiment of the present invention.
Figure 11:
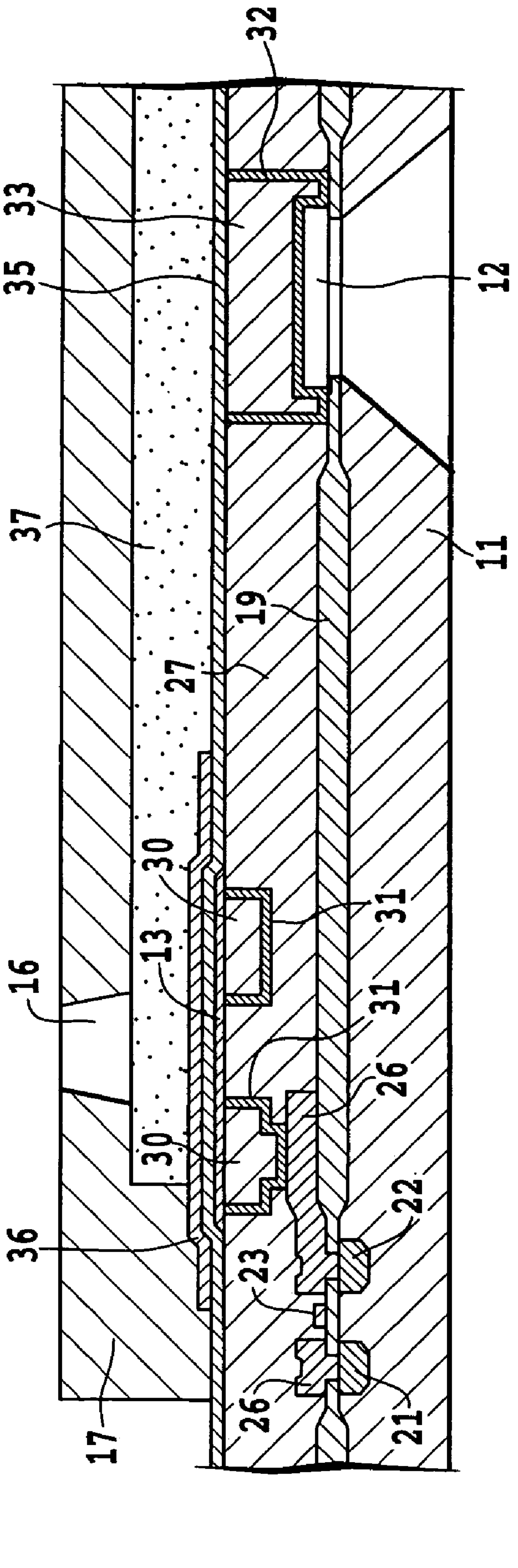
FIG. 11 is a sectional view of the printing element substrate representing a process for manufacturing the printing head according to the second embodiment of the present invention.

Thus, in a state shown in FIG. 10, when the liquid supply port 12 reaching the sacrificial layer 20 is formed by the anisotropic etching carried out on the rear surface of the silicon substrate 11, the invasion of the etching liquid upon the insulating layer 27 is completely prevented since the insulating layer 27 is separated from the sacrificial layer 20 by the $SiO_2$ layer 19 and the etching-stop layer 32 (see FIG. 11).

Figure 12:
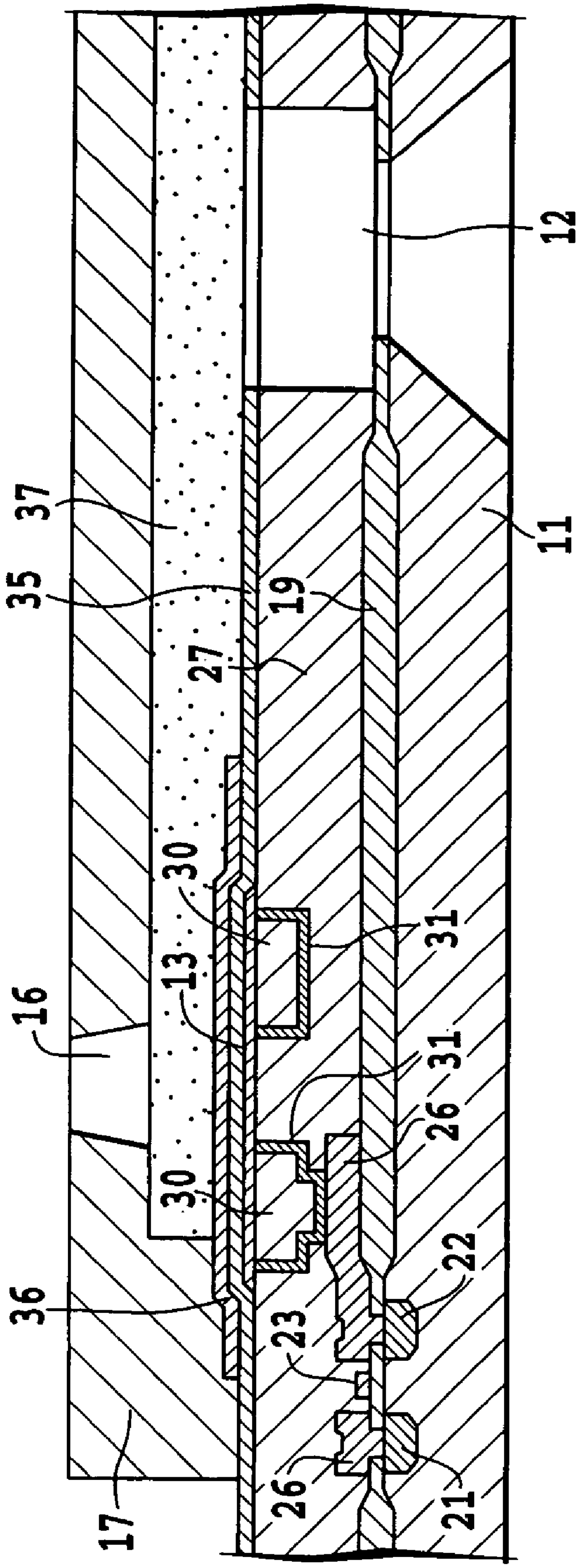
FIG. 12 is a sectional view of the printing element substrate representing a process for manufacturing the printing head according to the second embodiment of the present invention.
Figure 13:
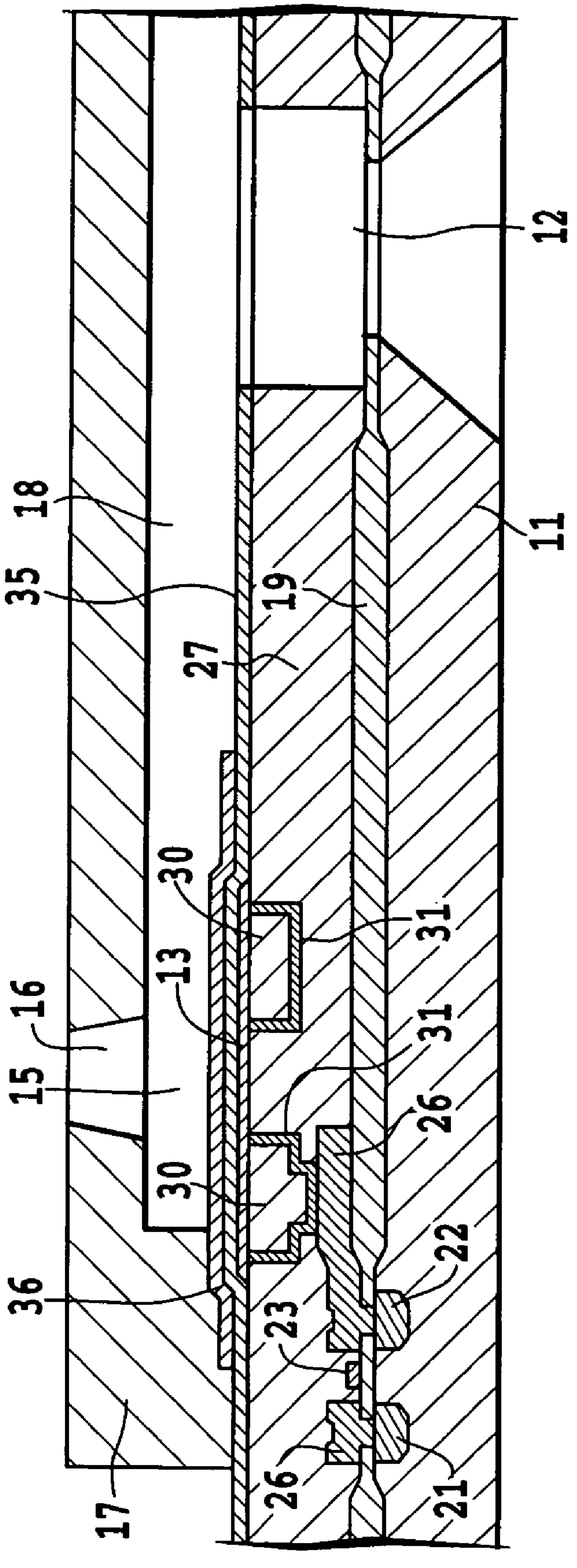
FIG. 13 is a sectional view of the printing element substrate representing a process for manufacturing the printing head according to the second embodiment of the present invention.
Figure 14:
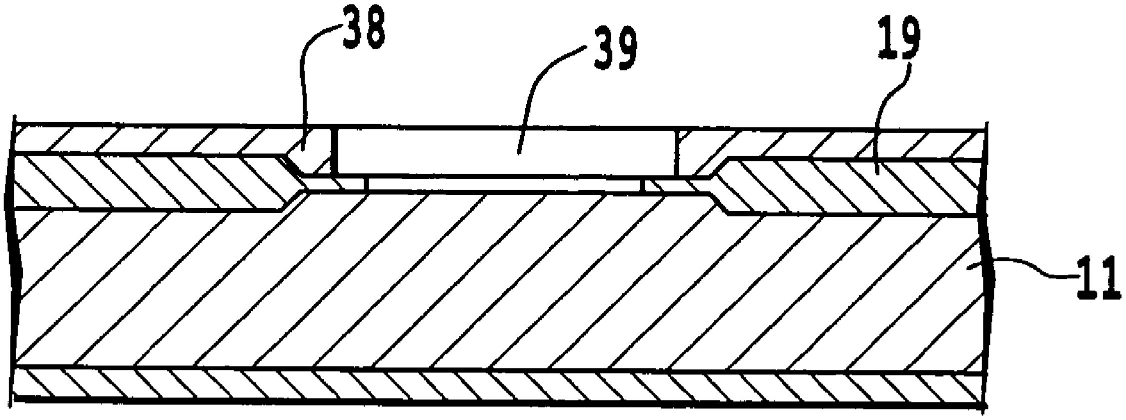
FIG. 14 is a sectional view of a printing element substrate representing a process for manufacturing a printing head according to a third embodiment of the present invention.

Thereafter, the etching-stop layer 32 and the embedded layer 33 are removed, and then a portion of the first protective layer 35 exposed to the liquid supply port 12 is removed by the dry etching (see FIG. 12). Further, the core 37 is removed by the etching to complete the printing element substrate 10 (see FIG. 13).

In the above-mentioned embodiment, the etching-stop layer 32 is formed simultaneously with the film formation of the surface treatment layer 31 by using the same material as the latter. However, if it is unnecessary to form the surface treatment layer 31, the etching-stop layer 32 may be formed of the same material as the embedded wiring layer 30 simultaneously with the formation of the latter.

Then, a third embodiment of the present invention is described with reference to FIGS. 14 to 18. In this case, to avoid the redundancy, the liquid supply port 12 will be solely described. In these drawings, parts having the same functions as in the preceding embodiments are indicated by the same reference numerals. That is, after the $SiO_2$ layer 19 is formed on the silicon substrate 11 and the PSG layer 38 is formed thereon by the cold CVD method, portions of the $SiO_2$ layer 19 and the PSG layer 38 in which the liquid supply port 12 is to be formed are simultaneously removed by the etching to form an opening 39, to which is exposed the silicon substrate 11 (see FIG. 14).

Next, the electrode wiring layer 26 of aluminum-copper alloy (see FIG. 4) is formed on the PSG layer 38 and patterned to have a predetermined shape. At this stage, the driver elements such as a drive transistor or others described hereinabove is completed.

Figure 15:
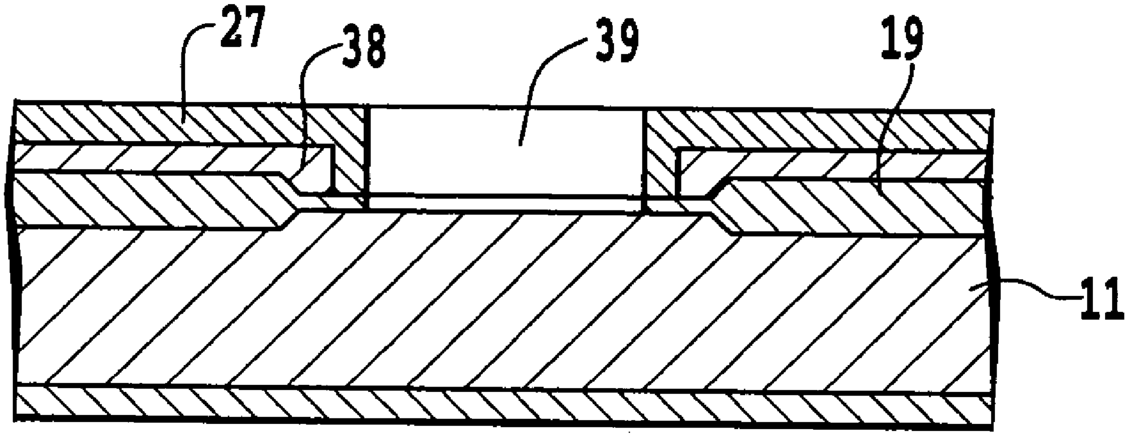
FIG. 15 is a sectional view of the printing element substrate representing a process for manufacturing the printing head according to the third embodiment of the present invention.
Figure 16:
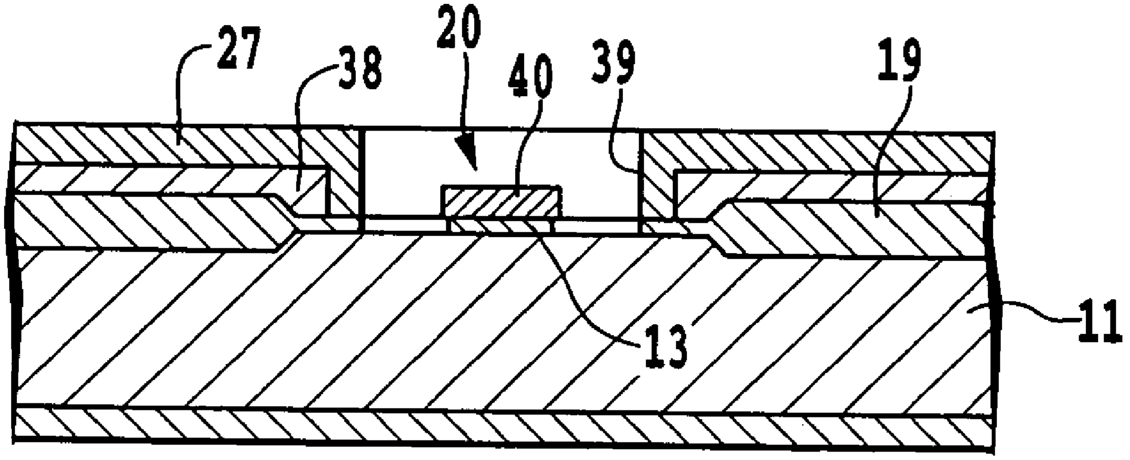
FIG. 16 is a sectional view of the printing element substrate representing a process for manufacturing the printing head according to the third embodiment of the present invention.
Figure 17:
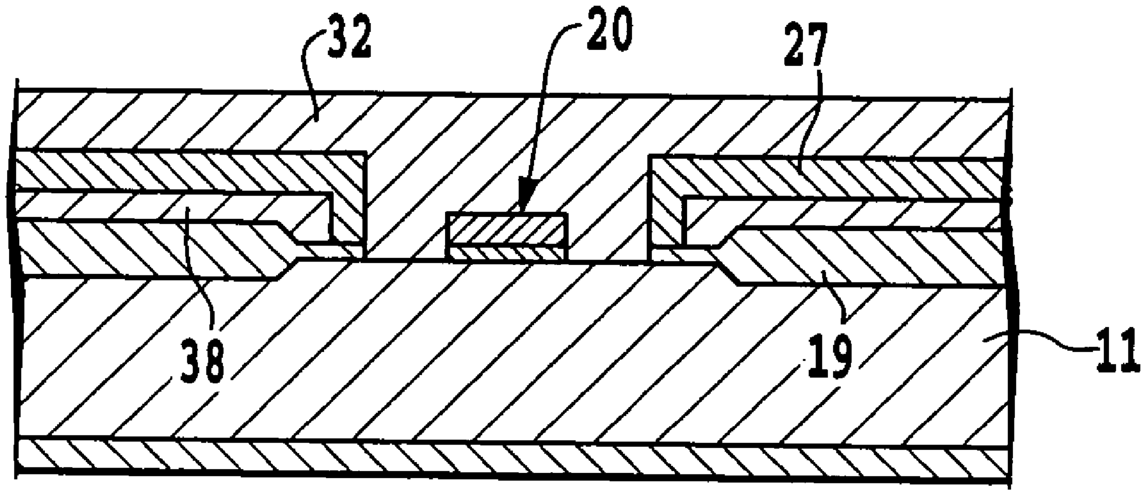
FIG. 17 is a sectional view of the printing element substrate representing a process for manufacturing the printing head according to the third embodiment of the present invention.

Then, the $SiO_2$ insulating layer 27 of 1.0 to 1.8 μm thick is deposited by the plasma CVD method and patterned to have a predetermined shape (see FIG. 15).

Next, the TaN electro-thermal transducer 13 (see FIG. 6) of 0.02 to 0.1 μm thick and the aluminum-copper alloy electrode layer not shown of 0.1 to 0.8 μm are consecutively deposited on the insulating layer 27 and patterned to have a predetermined shape. Simultaneously therewith, a double-layered sacrificial layer 20 consisting of the electro-thermal transducer 13 and the electrode layer 40 is formed of the same material in the opening 39 (see FIG. 16).

Then, the protective layer 35 (see FIG. 6) is formed of $Si_3N_4$ by the plasma etching method. Since this protective layer 35 has a function of the etching-stop layer 32, the residual stress thereof is reduced, for example, to $3\times10^8$ dyn/$cm^2$ or lower.

If the protective layer 35 thus formed is unsuitable for the protective layer for the electro-thermal transducer in view of the film quality or the step-coverage property, it may be formed as a double-layered structure having both of the tensile stress and compressive stress so that it satisfies the function of the protective layer 35 as well as the performance of the etching-stop layer 32. Concretely, when the etching-stop layer 32 of 0.4 μm thick is formed by the plasma CVD method, a first layer of 0.2 μm thick excellent in the tensile stress is first formed, and then a second layer of 0.2 μm excellent in the compressive stress is formed (see FIG. 17).

While conditions for depositing this etching-stop layer 32 are different in accordance with the performance of the plasma CVD apparatus, it may be possible to change the internal residual stress from the tensile stress to the compressive stress, for example, by regulating the electric power applied to the silicon substrate 11. That is, since the internal residual stress left in the etching-stop layer 32 is adjustable solely by changing the deposition conditions while leaving the silicon substrate 11 within the plasma CVD apparatus, it is unnecessary to add a new process.

Thereafter, to form the liquid supply port 12, a resin to be a mask for the anisotropic etching is coated on the rear surface of the silicon substrate 11 and patterned to have a predetermined shape.

Figure 7:
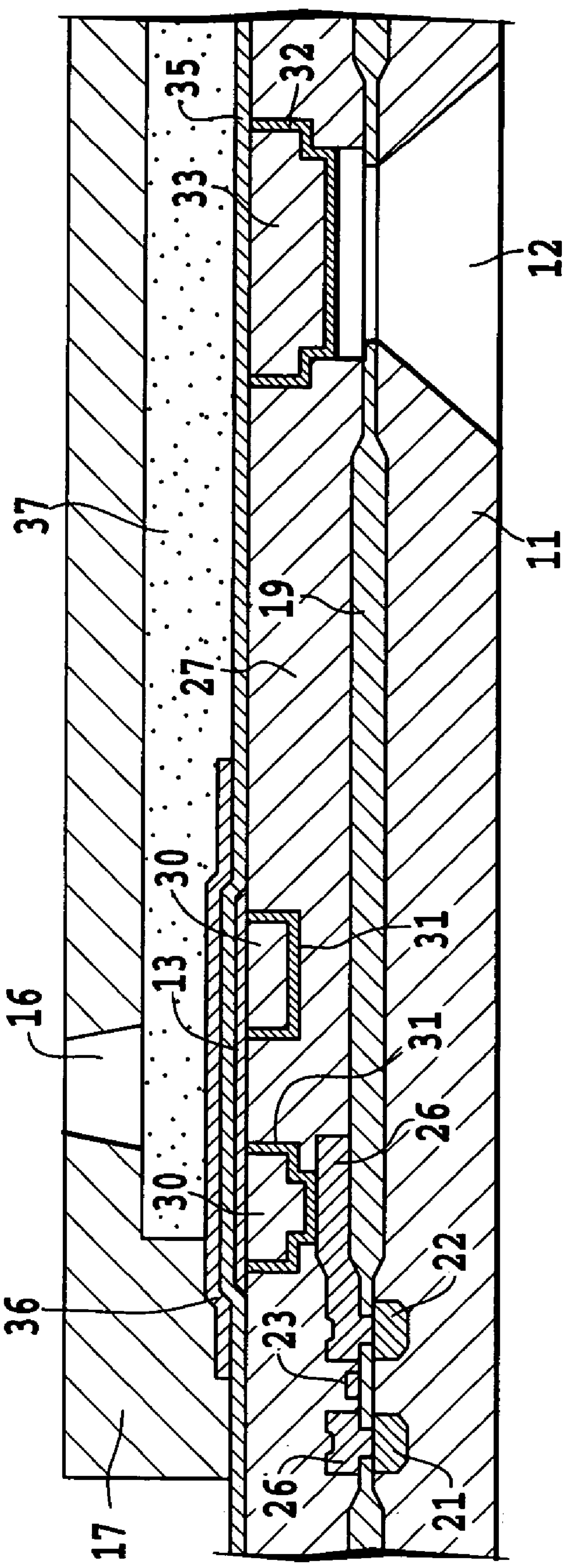
FIG. 7 is a sectional view of the printing element substrate representing a process for manufacturing the printing head according to the first embodiment of the present invention.
Figure 8:
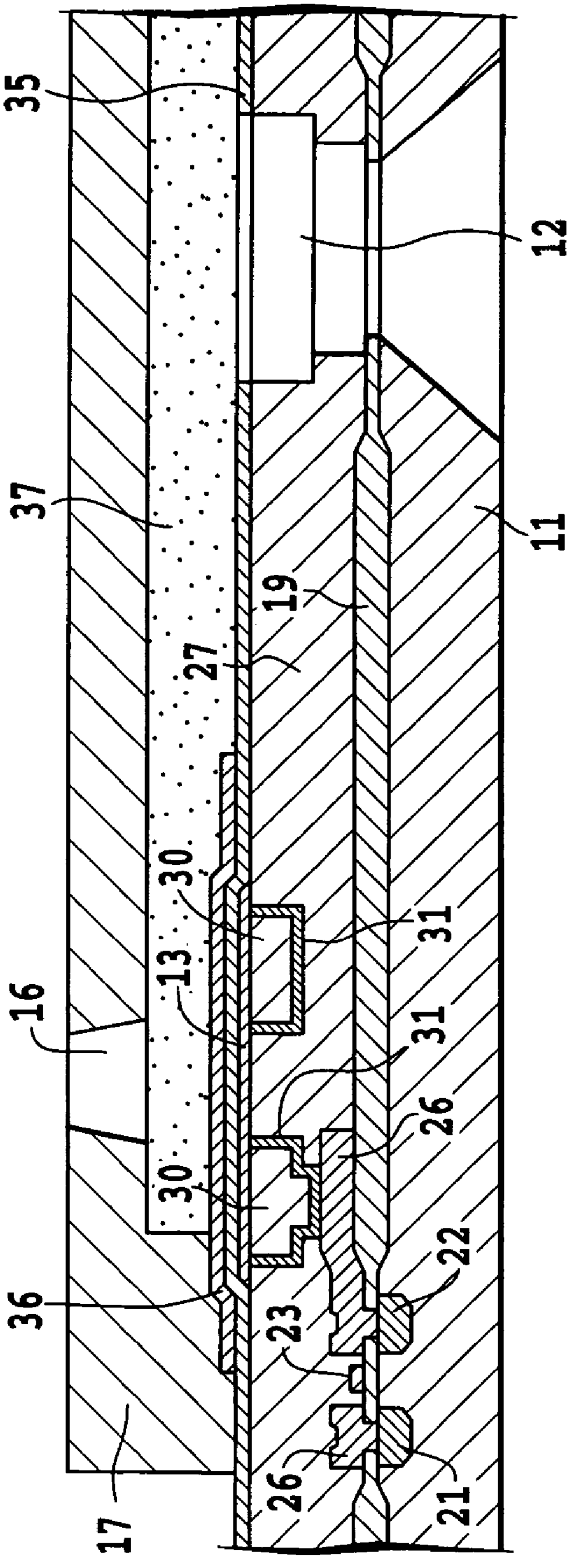
FIG. 8 is a sectional view of the printing element substrate representing a process for manufacturing the printing head according to the first embodiment of the present invention.
Figure 9:
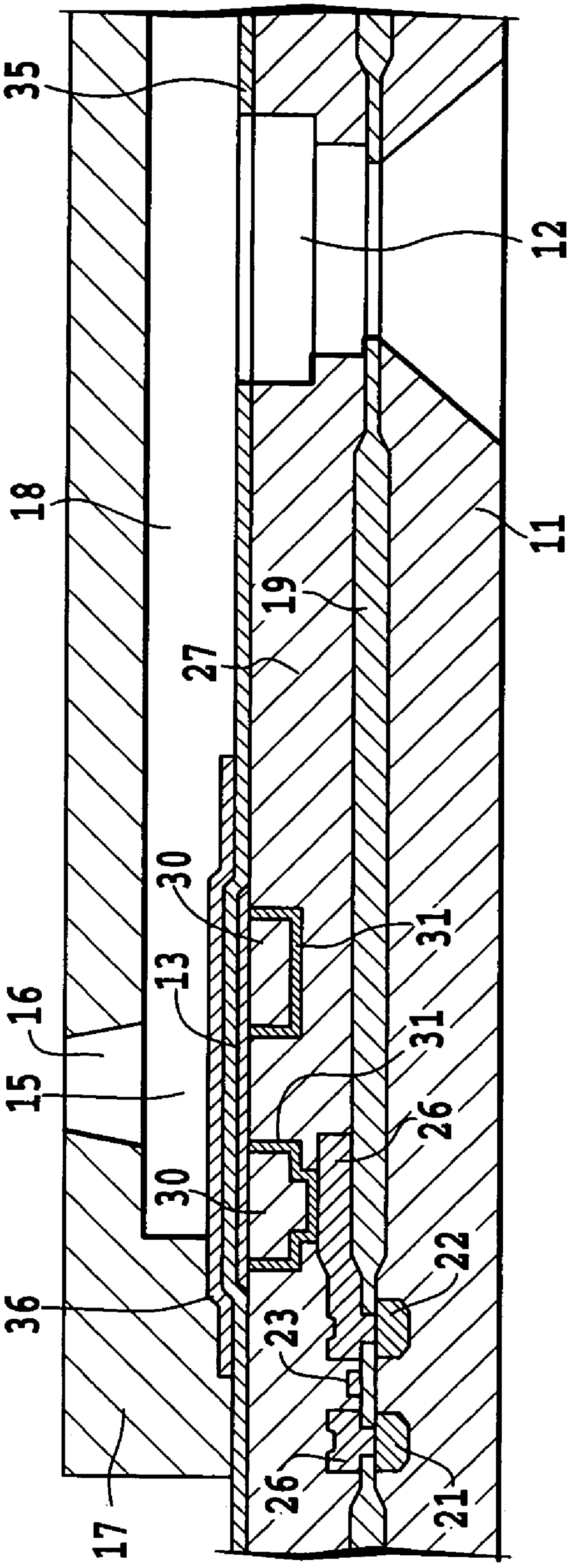
FIG. 9 is a sectional view of the printing element substrate representing a process for manufacturing the printing head according to the first embodiment of the present invention.

On the other hand, the formation of the upper plate member 17 starts in the same manner as in the preceding embodiment (see FIG. 7).

Figure 18:
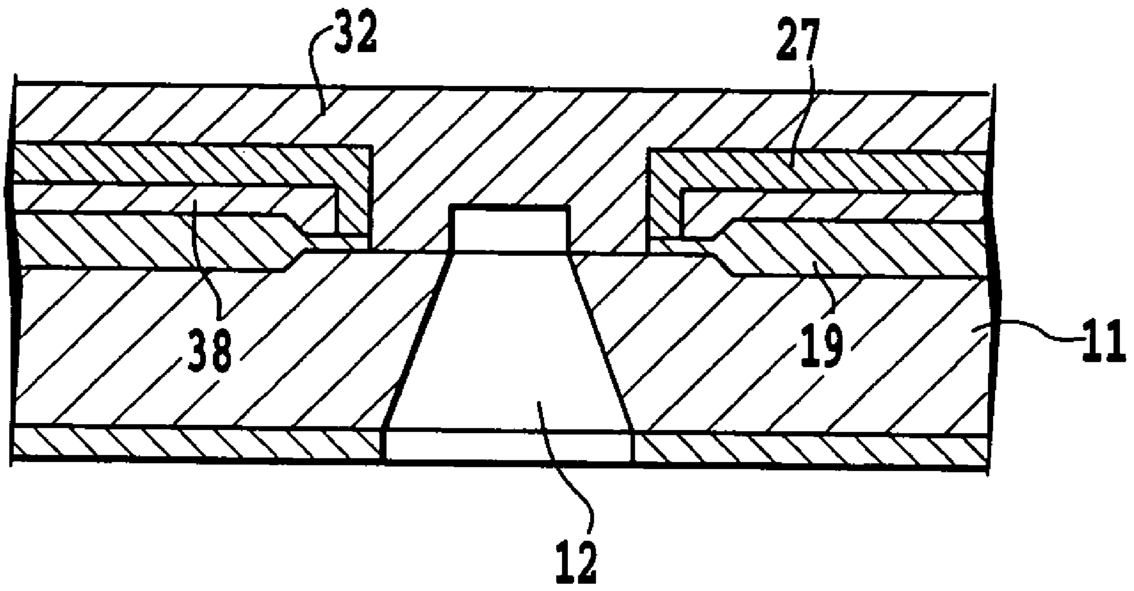
FIG. 18 is a sectional view of the printing element substrate representing a process for manufacturing the printing head according to the third embodiment of the present invention.

Next, the anisotropic etching is carried out on the rear surface of the silicon substrate 11 by using TMAH to form the liquid supply port 12 reaching the sacrificial layer 20 (see FIG. 18). In this case, there is no bulge or crack in the etching-stop layer 32 after the etching has been stopped.

Finally, the etching-stop layer 32 is removed by the dry etching, and further the core 37 (see FIG. 7) is removed.

In such a manner, an independent process is unnecessary for forming the sacrificial layer 20 and the etching-stop layer 32, whereby the liquid supply port having a favorable dimensional accuracy is obtainable without increasing the production cost of the printing element substrate 10.

In the above-mentioned embodiment, while the electro-thermal transducer 13 and the electrode layer 40 are adopted as the sacrificial layer 20, the electrode wiring layer 26 may be used as the sacrificial layer 20.

Then, a fourth embodiment of the inventive method for manufacturing a liquid ejection head will be described with reference to FIGS. 19 to 24, wherein parts having the same function as in the preceding embodiment will be indicated by the same reference numerals.

The embodiment described here is the steps of manufacturing the printed substrate in which the electrode wiring layer 26 is simultaneously provided in the same process as that of the sacrificial layer 20 above the PSG layer 38 (after forming the same) and below the electro-thermal transducer 13, i.e. a heat-generation resistive layer 41 (before forming the same), and the wiring layer is formed in the same process as that of the sacrificial layer after the patterning of the PSG layer described above.

Figure 19:
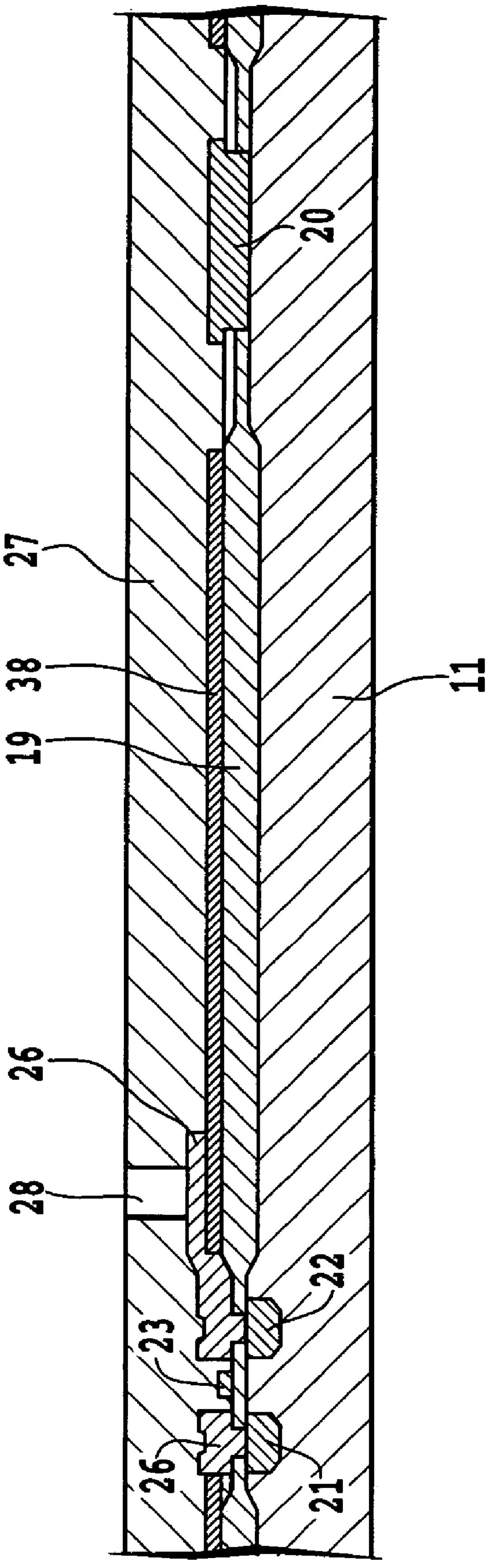
FIG. 19 is a sectional view of a printing element substrate representing a process for manufacturing a printing head according to a fourth embodiment of the present invention.

After the printing element substrate 10 has been manufactured by the same process as in the first embodiment shown in FIGS. 1 to 4, the first through-hole 28 is formed on the surface of the insulating layer 27 by the patterning (see FIG. 19).

Figure 20:
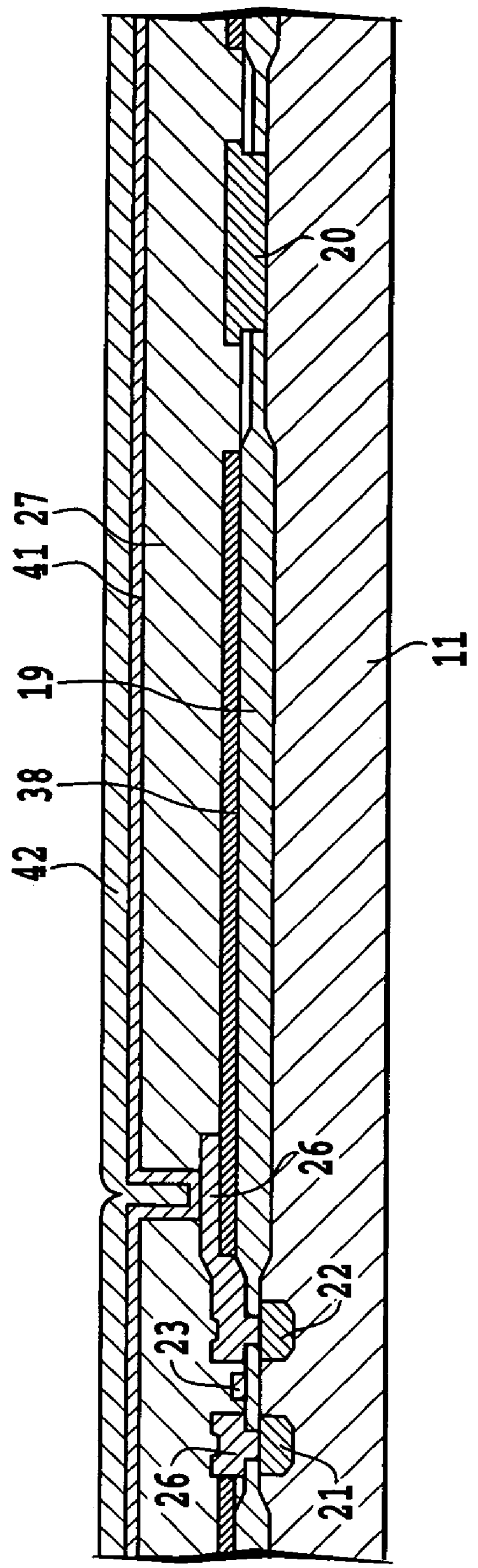
FIG. 20 is a sectional view of the printing element substrate representing a process for manufacturing the printing head according to the fourth embodiment of the present invention.
Figure 21:
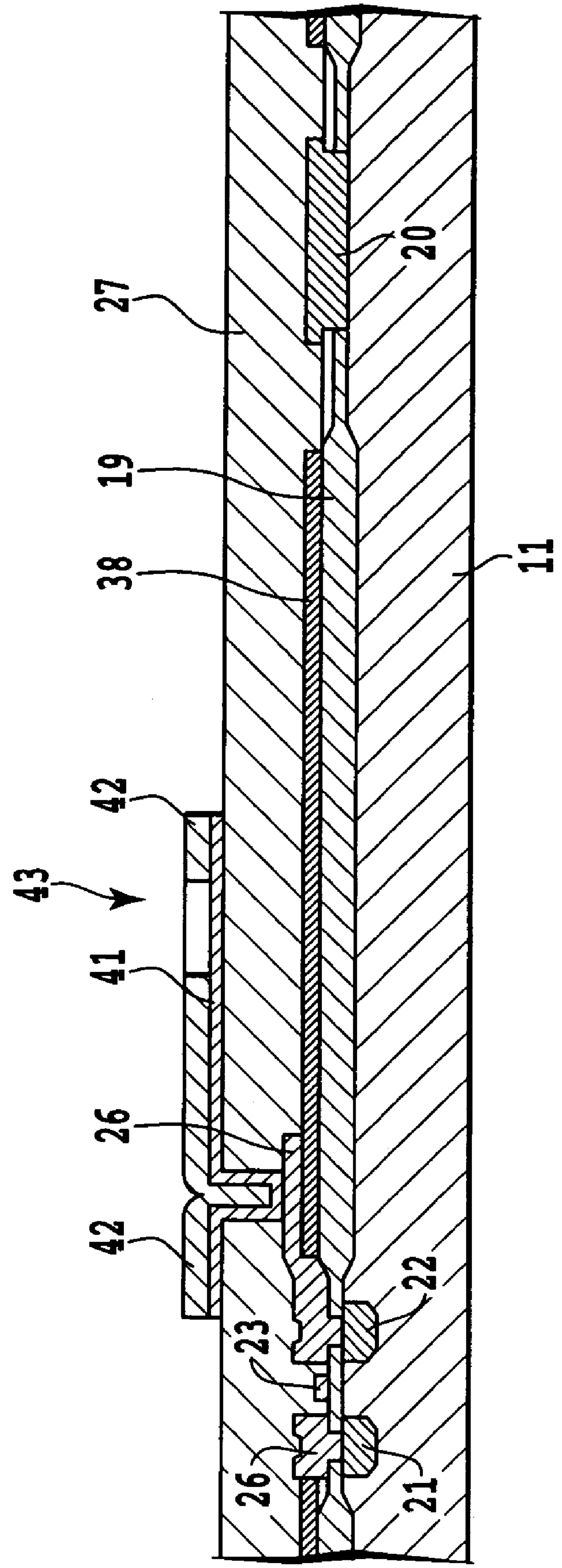
FIG. 21 is a sectional view of the printing element substrate representing a process for manufacturing the printing head according to the fourth embodiment of the present invention.
Figure 22:
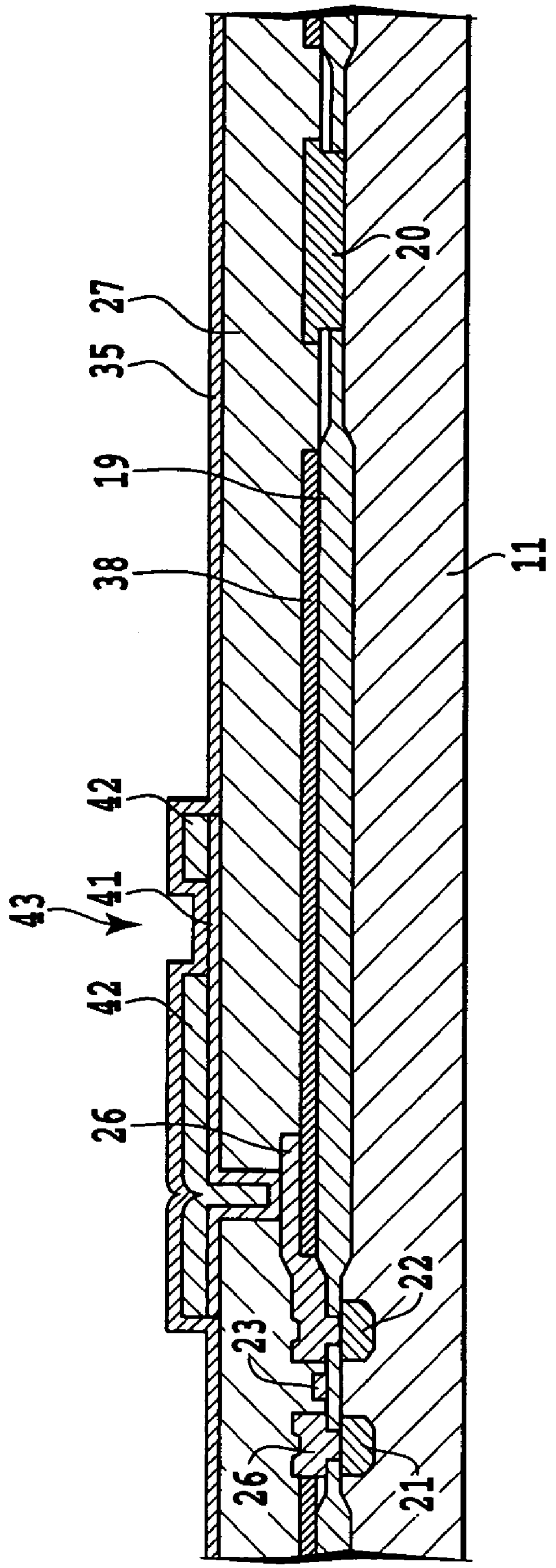
FIG. 22 is a sectional view of the printing element substrate representing a process for manufacturing the printing head according to the fourth embodiment of the present invention.

Next, the heat-generation resistive layer 41 is formed by the TaN sputtering, and an electrode layer 42 electrically connected to the heat-generating resistor is formed thereon (see FIG. 20). The electrode wiring layer 26 electrically connected to the electrode layer 42 via the heat-generation resistive layer 41 possessing electrical conductivity. Then, the electrode layer 42 and the heat-generation resistive layer 41 are modified to a predetermined pattern by the patterning to form a heat-generating resistor section 43 (see FIG. 21).

Figure 23:
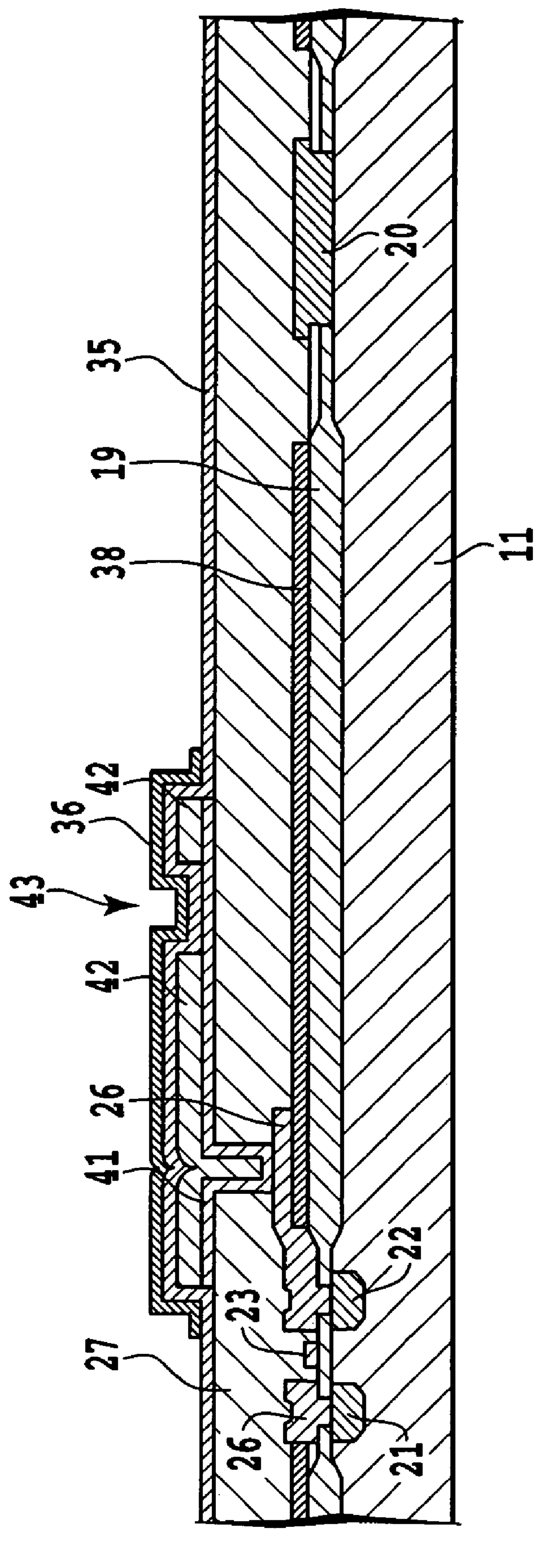
FIG. 23 is a sectional view of the printing element substrate representing a process for manufacturing the printing head according to the fourth embodiment of the present invention.

A first protective layer 35 also behaving as an etching-stop layer is formed of $Si_3N_4$ by the plasma CVD method (see FIG. 22), and a second protective layer 36 is formed to cover the heat-generating resistor section 43 via the first protective layer 35 by the patterning (see FIG. 23).

Thereafter, for the purpose of forming the liquid supply port 12, a resin (not shown) to be a mask for the anisotropic etching is coated on the rear surface of the silicon substrate 11, and formed at a desired pattern by the lithography.

Subsequently, the process proceeds to the formation of the upper plate member 17, wherein a resist to be a core 37 for forming a liquid flow path 18 and a liquid chamber 15 is coated on the surface and patterned to have a predetermined shape.

Figure 24:
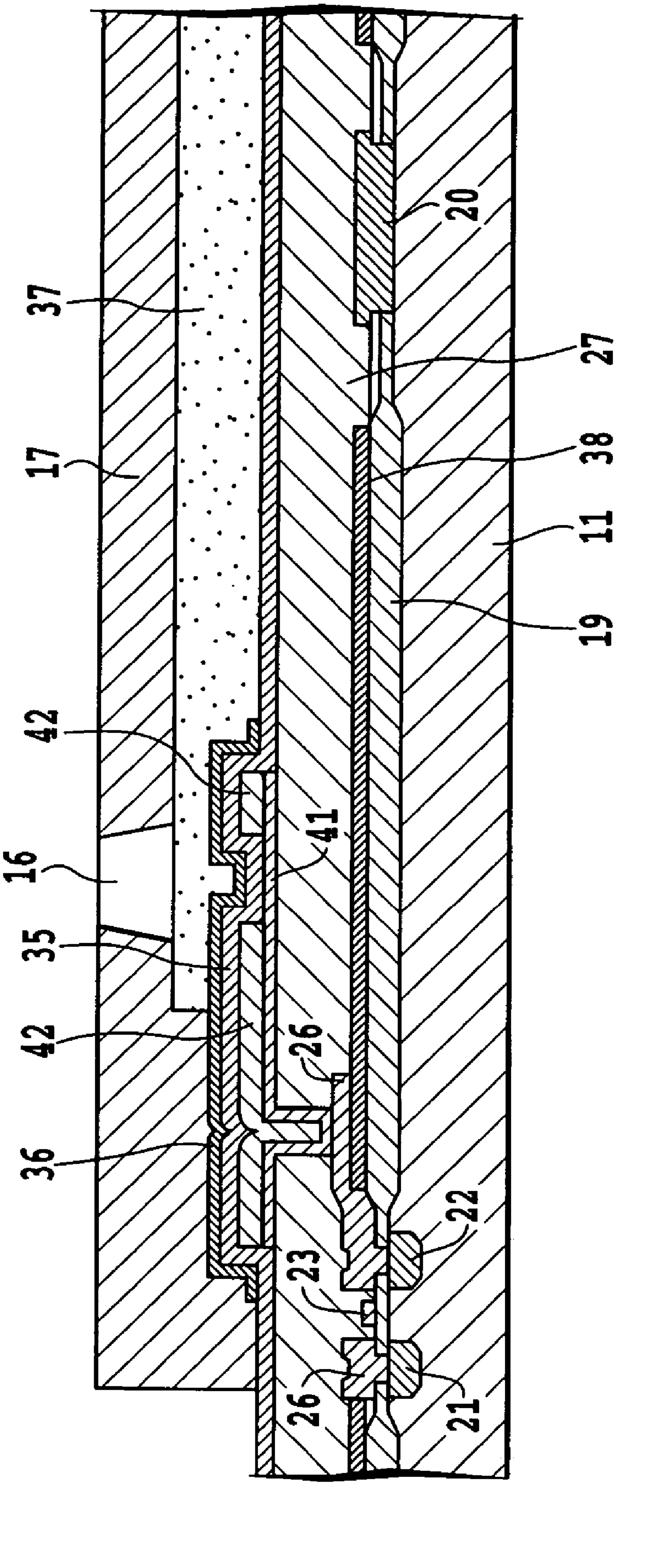
FIG. 24 is a sectional view of the printing element substrate representing a process for manufacturing the printing head according to the fourth embodiment of the present invention.
Figure 25:
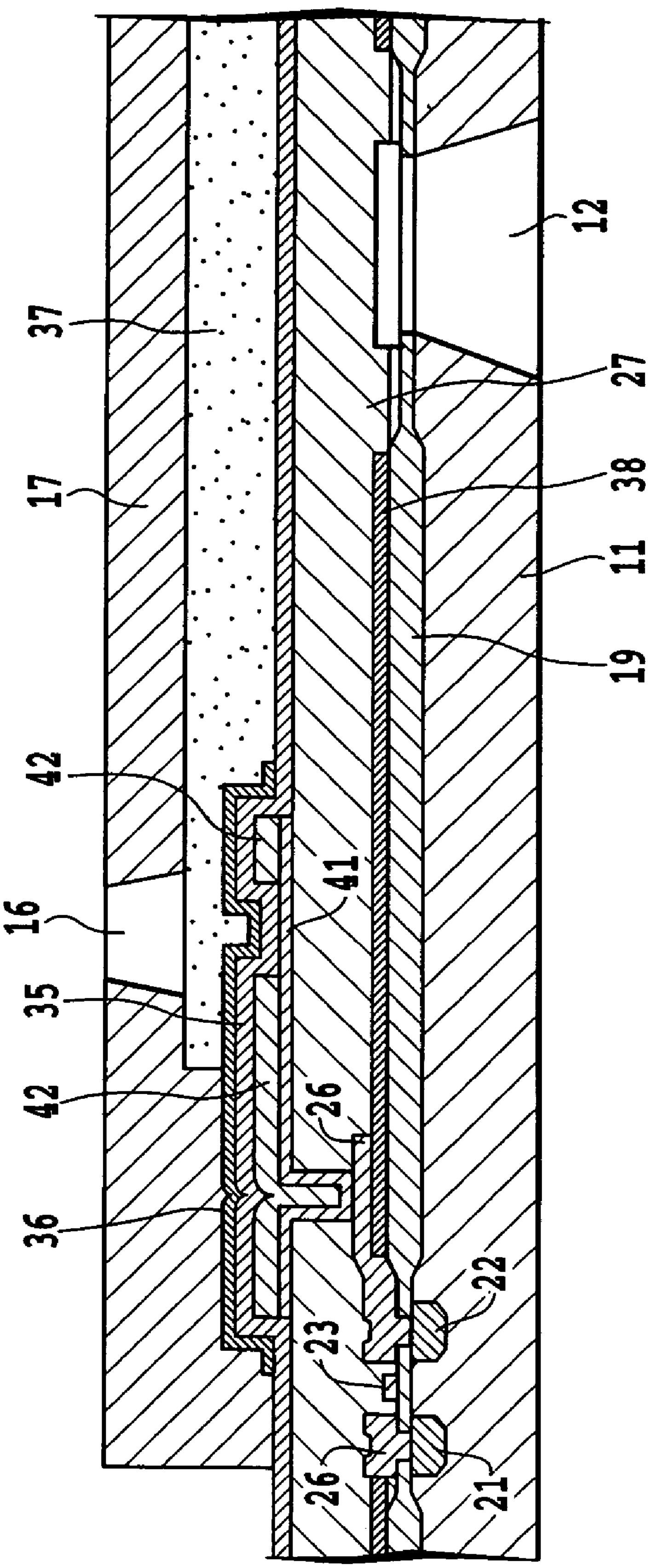
FIG. 25 is a sectional view of the printing element substrate representing a process for manufacturing the printing head according to the fourth embodiment of the present invention.
Figure 26:
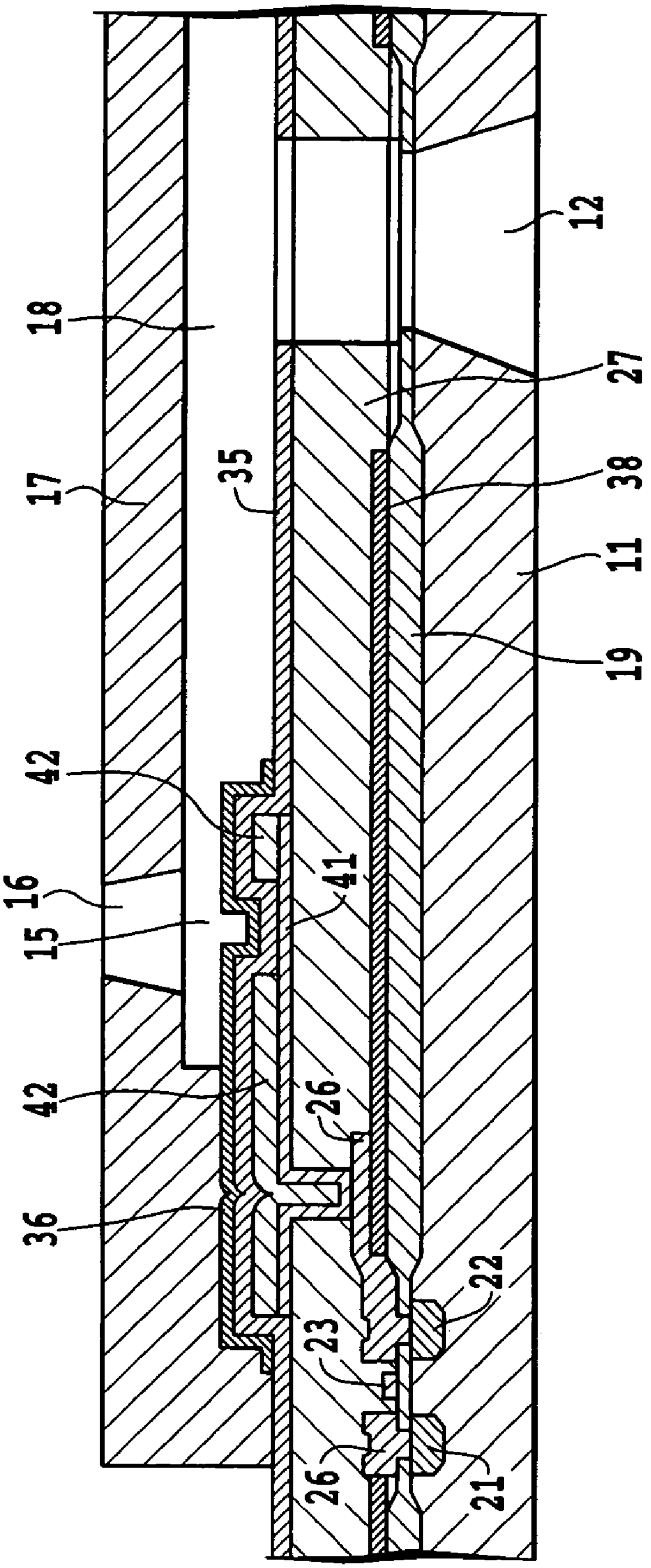
FIG. 26 is a sectional view of the printing element substrate representing a process for manufacturing the printing head according to the fourth embodiment of the present invention.

Then, a photosensitive epoxy resin to be the upper plate member 17 is coated on the core 37 and patterned to have a predetermined shape by the photolithography to form the ejection opening 16 (see FIG. 24).

Next, TMAH is used as the anisotropic etching liquid to etch the silicon substrate 11 from the rear surface thereof, thus forming the liquid supply port 12 reaching the sacrificial layer 20. This etching progresses from the rear surface of the silicon substrate 11 at an angle of 55.7 degrees to the sacrificial layer 20 encircled by the $SiO_2$ layer 19. Since the sacrificial layer 20 is isotropically etched with the etching liquid, the liquid supply port 12 has a shape corresponding to that of the sacrificial layer 20 at an upper end thereof and widening toward the rear surface of the silicon substrate 11 in a tapered manner (see FIG. 25).

Then, after the $SiO_2$ layer 19 and the first protective layer 35 have been removed by the etching, the core 37 is further removed by the etching. Thus, the printing element substrate 10 is completed (see FIG. 26).

According to such an embodiment, prior to forming the liquid supply port passing through the insulating layer by the etching starting from the rear surface of the substrate, the sacrificial layer in which the etching progresses faster than in the substrate and the etching-stop layer brought into contact with at least an upper surface of the sacrificial layer, for stopping the progress of the etching are formed in advance at a position for forming the liquid supply port. At this time, the process for forming the sacrificial layer is carried out simultaneously with the process for forming the electrode wiring section. Thus, it is possible to simplify the manufacturing process because an independent process for forming the sacrificial layer is eliminated. Particularly, when the sacrificial layer and the electrode wiring section are formed of the same material, such as that mainly composed of aluminum, the independent process for forming the sacrificial layer could be completely eliminated.

When the etching-stop layer is formed of the same material and by the same process for the insulating layer and the protective layer, an independent process for forming the etching-stop layer could be completely eliminated as well as the protective layer for this etching-stop layer is unnecessary, whereby the manufacturing process could be further simplified.

When the etching-stop layer is formed by the plasma CVD method to have the residual stress of $3\times10^8$ dyn/cm$^2$, or the etching-stop layer is formed by the plasma CVD method so that the tensile stress and the compressive stress are residual in the double-layered structure, the sacrificial layer could be formed of a material mainly composed of aluminum capable of being isotropically etched, whereby it is possible to carry out the process for forming the sacrificial layer simultaneously with that for forming the electrode wiring section.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method for manufacturing a liquid ejection head having a substrate including an ejection energy generating section for ejecting a liquid from an ejection opening, a driver element provided as a lower layer of the ejection energy generating section via an insulating layer for driving the ejection energy generating section, an electrode wiring section electrically connecting the driver element to the ejection energy generating section, formed of a material composed mainly of aluminum, a protective layer formed on the insulating layer to cover the ejection energy generating section, and a liquid supply port therethrough, comprising the steps of:

forming a sacrificial layer at a position at which the liquid supply port is to be formed, by using the same material as that of the electrode wiring section, when the electrode wiring section is formed;

forming an anti-etching layer for covering the sacrificial layer, the anti-etching layer having durability against an etching liquid;

etching the substrate with the etching liquid from a surface thereof opposite to a surface of the substrate on which the ejection energy generating section is formed until the sacrificial layer is exposed;

further proceeding with the etching to remove the sacrificial layer and expose a portion of the anti-etching layer to form the liquid supply port; and forming the liquid supply port in the substrate by removing the exposed anti-etching layer.

2. A method for manufacturing a liquid ejection head as claimed in claim 1, wherein the anti-etching layer is formed by using the same material as that of the insulating layer or the protective layer and in the same step as a step for forming the insulating layer or the protective layer.

3. A method for manufacturing a liquid ejection head as claimed in claim 2, wherein the material forming the insulating layer is silicon oxide and that forming the protective layer is silicon nitride.

4. A method for manufacturing a liquid ejection head as claimed in claim 1, wherein the driver element is a transistor, and the electrode wiring section includes a source and a drain of the transistor.

5. A method for manufacturing a liquid ejection head as claimed in claim 1, wherein the anti-etching layer is formed by a plasma CVD method and has a residual stress of $3\times10^8$ dyn/cm$^2$ or less.

6. A method for manufacturing a liquid ejection head as claimed in claim 1, wherein the anti-etching layer is formed by a plasma CVD method and has a residual tensile stress and a residual compressive stress in a double-layered structure.

7. A method for manufacturing a liquid ejection head as claimed in claim 1, wherein the anti-etching layer is formed to encircle an upper surface and a side surface of the sacrificial layer.

8. A method for manufacturing a liquid ejection head as claimed in claim 1, wherein the ejection energy generating section has an electrothermal transducer for generating thermal energy for ejecting the liquid from the ejection opening by generating film boiling in the liquid.

9. A method for manufacturing a liquid ejection head as claimed in any one of claims 1 to 8, wherein the liquid ejection head further has an upper plate member formed above the insulating layer of the substrate to define a liquid chamber between the upper plate member and the insulating layer, and the ejection opening communicates with the liquid chamber, said method further comprising the steps of:

forming a first resinous layer having a shape corresponding to the liquid chamber on the protective layer;

forming a second resinous layer having a shape corresponding to the upper plate member on the first resinous layer;

removing a portion of the second resinous layer corresponding to the ejection opening from the second resinous layer; and removing the first resinous layer after the upper plate member has been formed.

* * * * *

UNITED STATES PATENT AND TRADEMARK OFFICE
CERTIFICATE OF CORRECTION

PATENT NO. : 7,250,113 B2
APPLICATION NO. : 10/868854
DATED : July 31, 2007
INVENTOR(S) : Komuro et al.

It is certified that error appears in the above-identified patent and that said Letters Patent is hereby corrected as shown below:

COLUMN 2:
Line 27, "which stress is adjusted" should read --which is stress adjusted--.
Line 52, "material;" should read --material,--.
Line 53, "silicon;" should read --silicon,--.

COLUMN 3:
Line 67, "formed of by" should read --formed by--.

COLUMN 4:
Line 50, "therefore" should read --therefor--.

COLUMN 5:
Line 7, "therefore" should read --therefor--.

COLUMN 7:
Line 24, "be includes" should read --be included--.
Line 41, "not shown" should read --(not shown)--.
Line 43, "not" should read --(not--.
Line 44, "shown" should read --shown)--.

COLUMN 8:
Line 53, "selected not to reach" should read --selected so as not to reach--.

COLUMN 9:
Line 7, "therefore." should read --therefor.--.
Line 67, "in that" should read --that--.

UNITED STATES PATENT AND TRADEMARK OFFICE

CERTIFICATE OF CORRECTION

PATENT NO. : 7,250,113 B2
APPLICATION NO. : 10/868854
DATED : July 31, 2007
INVENTOR(S) : Komuro et al.

It is certified that error appears in the above-identified patent and that said Letters Patent is hereby corrected as shown below:

COLUMN 10:
Line 62, “not shown” should read --(not shown)--.

COLUMN 12:
Line 7, “electrically” should read --is electrically--.

Signed and Sealed this

Tenth Day of March, 2009

JOHN DOLL
*Acting Director of the United States Patent and Trademark Office*